(12) United States Patent
Chan et al.

(10) Patent No.: US 7,629,633 B2
(45) Date of Patent: Dec. 8, 2009

(54) VERTICAL THIN FILM TRANSISTOR WITH SHORT-CHANNEL EFFECT SUPPRESSION

(76) Inventors: Isaac Wing Tak Chan, 533 Fallingbrook Drive, Waterloo, Ontario (CA) N2L 4N2; Arokia Nathan, 55 Culpepper Drive, Waterloo, Ontario (CA) N2L 5K8

(*) Notice: Subject to any disclaimer, the term of this patent is extended or adjusted under 35 U.S.C. 154(b) by 454 days.

(21) Appl. No.: 11/332,483

(22) Filed: Jan. 17, 2006

(65) Prior Publication Data
US 2006/0175609 A1 Aug. 10, 2006

Related U.S. Application Data

(63) Continuation-in-part of application No. 11/133,411, filed on May 20, 2005, now abandoned.

(60) Provisional application No. 60/572,501, filed on May 20, 2004.

(51) Int. Cl.
*H01L 31/112* (2006.01)
(52) U.S. Cl. .................................................... 257/263
(58) Field of Classification Search ................. 257/263; 438/156, 268, 269, 270, 271, 272, 273, 274
See application file for complete search history.

(56) References Cited

U.S. PATENT DOCUMENTS

| 4,543,320 A | 9/1985 | Vijan |
| 4,620,208 A | 10/1986 | Fritzsche et al. |
| 4,701,996 A | 10/1987 | Calviello |
| 4,757,361 A | 7/1988 | Brodsky et al. |
| 4,924,279 A | 5/1990 | Shimbo |
| 6,165,823 A | 12/2000 | Kim et al. |

OTHER PUBLICATIONS

Y. Kuo, "Amorphous Silicon Thin Film Transistors," Kluwer Academic Publishers, Norwell, MA, 2003.
Y. Uchida et al., "Proposed vertical-type amorphous-silicon field-effect transistors", IEEE Electron. Device Lett., vol. 5(4), Apr. 1984, pp. 105-107.
K.S. Karim et al., Amorphous silicon active pixel sensor readout circuit for digital imaging, IEEE Trans. Elec. Dev., vol. 50(1), Jan. 2003, pp. 200-208.
Sang Soo Kim, "Fabricating Color TFT-LCDs," 2001, Information Display, pp. 22-26.

(Continued)

*Primary Examiner*—Kenneth A Parker
*Assistant Examiner*—Anthony Ho

(57) ABSTRACT

A vertical thin film transistor (TFT) structure allows for a channel length to be scaled down, below that allowed by lateral TFT structures, to nanoscale (i.e., below 100 nm). However, while reducing the channel length, short-channel effects have been found in previous VTFT structures. Aspects of the new vertical TFT structure allow for the suppression of some of the short-channel effects. Advantageously, the capability of defining nanoscale channel length with short-channel effect suppression allows for p-channel vertical TFTs, where previously these were impractical. Furthermore, in aspects of the vertical TFT structure, the gate electrode is entirely vertical and by eliminating the horizontal overlap of the gate electrode over the drain electrode that present in earlier vertical TFT structures, parasitic gate-to-drain capacitance is eliminated. The vertical TFT structure provides size advantages over lateral TFTs and, furthermore, allows a TFT to be built at the intersection of electrode lines in an active-matrix configuration.

23 Claims, 22 Drawing Sheets

OTHER PUBLICATIONS

"Silicon films" www.Library.uu.nl/digichief/dip/diss.
Scott Thompson et al., "MOS Scaling: transistor Challenges for the 21st Century", Intel Technology Journal, Q#, 1998.
Sang Soo Kim, "Electronic Aspects AMLCDs," Information Display, 2001, pp. 22-26.
Enrico Gili, "Fabrication of Vertical MOS Transistors at Southampton University," Jul. 2003.
T. Sandstrom and L. Odselius, Large-area High-quality Photomasks, Proceedings of SPIE—vol. 2621, Dec. 1995, pp. 312-218.
J.T. Rahn et al., "High Resolution X-ray imaging using amorphous selenium: feasibility of a flat panel self-scanned detector for digital radiology," Med. Phys. 22 (10), Octob.
W. Zhao and J.A. Rowlands, "X-ray imaging using amorphous selenium: feasibility of a flat panel self-scanned detector for digital radiology," Med. Phys. 22(10), Oct. 1995, pp. 1595-1604.
A. Nathan et al., Driving schemes for a-Si and LTPS AMOLED displays, J. Disp. Technol., vol. 1(2), Dec. 2005, pp. 267-277.
Kaushik Roy, "Leakage Current Mechanisms and Leakage Reduction Techniques in Deep-Submicrometer CMOS Circuits", Proceddings of the IEEE, vol. 91, No. 2, Feb. 2003.

VERTICAL THIN FILM TRANSISTOR WITH SHORT-CHANNEL EFFECT SUPPRESSION

CROSS-REFERENCE TO RELATED APPLICATIONS

This application is a continuation-in-part of U.S. patent application Ser. No. 11/133,411 filed May 20, 2005, now abandoned, and claims benefits from U.S. provisional patent application Ser. No. 60/572,501, filed May 20, 2004, the contents of all of which are hereby incorporated by reference.

FIELD OF THE INVENTION

The present invention relates to thin film transistors and, more particularly, to vertical thin film transistors that suppress short-channel effects and methods for fabrication of such vertical thin film transistors.

BACKGROUND

Thin film transistors (TFTs) are electronic switching devices commonly used in active-matrix, flat-panel, electronic devices, such as an Active-Matrix, Liquid Crystal Displays (also known as an AMLCDs or, sometimes, a TFT-LCDs) or optical/X-ray Active-Matrix, Flat-Panel Imagers (also known as an AMFPI). The core active-matrix technology for display and imaging is basically the same. This technology utilizes a two-dimensional array of active electronic switching devices, such as TFTs, which are connected to gate lines and data lines to be selectively turned on and off to form a spatial display or to sense an image.

For image sensing electronics, each pixel usually includes a photodiode as an optical photodetector sensor connected to a pixel electrode. X-ray detection can also be performed by adding a phosphor layer above the photodiode sensor to convert received X-rays into optical photons for subsequent optical detection.

For display electronics, each pixel is associated with liquid crystals connected to the pixel electrode. The timing for TFT switching is often controlled by peripheral circuit drivers, which are typically implemented by crystalline silicon Complementary Metal-Oxide-Semiconductor (CMOS) Integrated Circuits (ICs) with interfacing bond wires connected to each gate line and each data line.

TFTs are considered to be good for active-matrix applications because the materials used in the manufacturing process, e.g., hydrogenated amorphous silicon (a-Si:H) and amorphous silicon nitride (a-SiN$_x$:H), can be fabricated between 120 and 300° C., which is a thermal budget compatible with the commonly used substrate materials for active-matrix electronics, e.g., glass, plastic, ceramic, insulating-film-coated steel and insulating-film-coated semiconductor.

Currently, for large-area active-matrix imagers and displays, lithographic techniques are constrained to 5-μm or larger features (see, for example, T. Sandstrom and L. Odselius, Large-area high-quality photomasks, Proceedings of SPIE—Volume 2621, December 1995, pp. 312-318). This is due to stringent requirements of photo-etching precision and high yield on TFTs and interconnect-line processes for virtually flawless images and low manufacturing cost. Consequently, the advanced lithography for sub-micron to nano IC processes is usually not applicable to the production of large-area electronics. The channel length of the TFT may, therefore, be no shorter than about 5 μm and the overall area of the TFT (15×10 μm$^2$), including the source electrode, gate electrode and drain electrode, may be determined from a length dimension that is approximately triple the 5 μm lithographic constraint and a width dimension that is at least double the 5 μm lithographic constraint.

In the traditional, lateral TFT design for pixelated active-matrix imagers, each TFT occupies part of the pixel area as a switch for the photo-sensor, see Y. Kuo, "Amorphous Silicon Thin Film Transistors," Kluwer Academic Publishers, Norwell, Mass., 2003. As a result, TFT size imposes a limit to the array resolution, since the pixel fill factor, defined as a ratio of the photosensitive area to the pixel area, diminishes rapidly as pixel pitch is reduced below 100 μm.

The present solution to resolve this constraint on fill factor is by stacking a continuous layer of photo-sensitive material on top of the TFT matrix, see J. T. Rahn et al., High resolution X-ray imaging using amorphous silicon flat-panel arrays, IEEE Nucl. Sci. Symp. 1998, Conf. Rec., Vol. 2, pp. 1073-1077. However, since lateral TFTs always occupy some pixel area, in addition to that area occupied by the gate lines and the data lines, the degree to which pixel size may be reduced is limited by the size of the lateral TFT.

To eliminate the dependence of the channel length on the photolithography technique, a vertical TFT (i.e., a VTFT) structure has been proposed wherein channel material is oriented in the vertical direction. Rather that being laid out laterally, components of a VTFT are layered. In particular, a doped source ohmic contact layer and a similarly doped drain ohmic contact layer are stacked on either side of a dielectric in a sandwich structure. An active channel layer is provided along the side of the sandwich structure and a gate along the active channel layer. The thickness of the dielectric is then the determining factor for the length of the channel, rather than lithographic techniques. The proposed VTFT structure allows the channel length to be scaled down, below that allowed by lateral TFTs, to nanometer-scale (i.e., below 100 nm).

It can be shown that such a VTFT has a significant switching speed improvement over a lateral TFT counterpart. Advantageously, VTFTs allow the building of peripheral circuitry directly on the panel to replace CMOS ICs and interfacing overheads and, thereby, allow for a reduction in manufacturing cost. However, the proposed VTFT includes limiting factors for high-speed switching.

Accordingly, there remains a need for a compact TFT structure that reduces limiting factors for high-speed switching.

SUMMARY

Intermediate layers may be positioned between the ohmic contact layers and the dielectric of a VTFT, where the intermediate layers are doped counter to the doping of the ohmic contact layers. The intermediate layers allow for the reduction of limiting factors for high-speed switching. In particular, to the degree to which the length of the channel may be reduced in the VTFT structure can lead to so-called short-channel effects. The intermediate layers may be seen to aid in the suppression of some of the short-channel effects. The VTFT also allows significantly reduced TFT size when compared to lateral TFTs, based on the standard photo-etching and thin film deposition processes. Standard fabrication processes for the VTFTs allow conventional equipment to be used with limited additional process equipment or capital investments.

In accordance with an aspect of the present invention there is provided a vertical thin film transistor. The vertical thin film transistor includes a source semiconductor layer doped in a first manner and in communication with a source electrode, a drain semiconductor layer vertically spaced from the source semiconductor layer, doped in the first manner and in communication with a drain electrode, a first intermediate semiconductor layer doped in a second manner counter to the first manner and formed adjacent to the source semiconductor layer, between the source semiconductor layer and the drain semiconductor layer, a second intermediate semiconductor layer doped in the second manner and formed adjacent to the drain semiconductor layer, between the source semiconductor layer and the drain semiconductor layer and a dielectric layer formed between the first intermediate semiconductor layer and the second intermediate semiconductor layer, where the source semiconductor layer, the first intermediate semiconductor layer, the dielectric layer, the second intermediate semiconductor layer and the drain semiconductor layer are arranged to define a surface extending from the source semiconductor layer to the drain semiconductor layer. The vertical thin film transistor also includes a channel semiconductor layer formed on the surface, wherein a conducting channel may be established between the source semiconductor layer and the drain semiconductor layer and a gate electrode proximate the channel semiconductor layer such that a voltage applied to the gate electrode controls a conductivity of the conducting channel.

In accordance with another aspect of the present invention there is provided a method of fabricating a vertical thin film transistor. The method includes depositing a source electrode layer on a substrate, the source electrode layer having a first source end and a second source end, depositing a source ohmic contact semiconductor layer on the source electrode layer doped in a first manner, depositing a first intermediate semiconductor layer on the source ohmic contact semiconductor layer, where the first intermediate layer is doped in a second manner, where the second manner is counter the first manner, depositing a dielectric layer on the first intermediate layer of the source structure and on the substrate, depositing a second intermediate semiconductor layer on the dielectric layer, where the second intermediate semiconductor layer is doped in the second manner, depositing a drain ohmic contact semiconductor layer, on the second intermediate semiconductor layer, where the drain ohmic contact semiconductor layer is doped in the first manner, depositing a drain electrode layer on the drain ohmic contact semiconductor layer, etching the drain electrode layer, the drain ohmic contact semiconductor layer, the second intermediate semiconductor layer, the dielectric layer, the source ohmic contact semiconductor layer and the first intermediate semiconductor layer to form a transistor structure surface, depositing an active channel semiconductor layer proximate the first drain end of the drain structure, along the transistor surface and on the source electrode, depositing a gate insulator layer on the active layer and depositing a gate electrode layer on the gate insulator layer.

In accordance with further aspect of the present invention there is provided a vertical thin film transistor. The vertical thin film transistor includes a source structure, a drain structure, a dielectric layer deposited between the source structure and the drain structure and a gate structure. The source structure includes a source electrode layer, a source ohmic contact semiconductor layer in communication with the source electrode layer, doped in a first manner and a source intermediate semiconductor layer deposited on the source ohmic contact semiconductor layer and doped in a second manner, where the second manner is counter the first manner. The drain structure includes a drain intermediate semiconductor layer doped in the second manner, a drain ohmic contact semiconductor layer deposited on the drain intermediate semiconductor layer and doped in the first manner and a drain electrode layer in communication with the drain ohmic contact layer. The source ohmic contact semiconductor layer, the source intermediate semiconductor layer, the dielectric layer, the drain intermediate semiconductor layer and the drain ohmic contact semiconductor layer are arranged to define a surface extending from the source electrode layer to the drain electrode layer. The gate structure includes an active semiconductor layer deposited over the drain electrode layer, along the surface and over the source electrode layer, a gate insulator layer deposited adjacent the active semiconductor layer and a gate electrode layer deposited adjacent the gate insulator layer.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate example embodiments of this invention.

DETAILED DESCRIPTION

There are three basic types of TFT structures: Staggered, which is also known as the top gate; Inverted, staggered, which is also known as the bottom gate; and Coplanar, see Y. Kuo, "Amorphous Silicon Thin Film Transistors," Kluwer Academic Publishers, Norwell, Mass., 2003. Among the Inverted, staggered type, there are two categories: tri-layer; and bi-layer.

Figure 1:
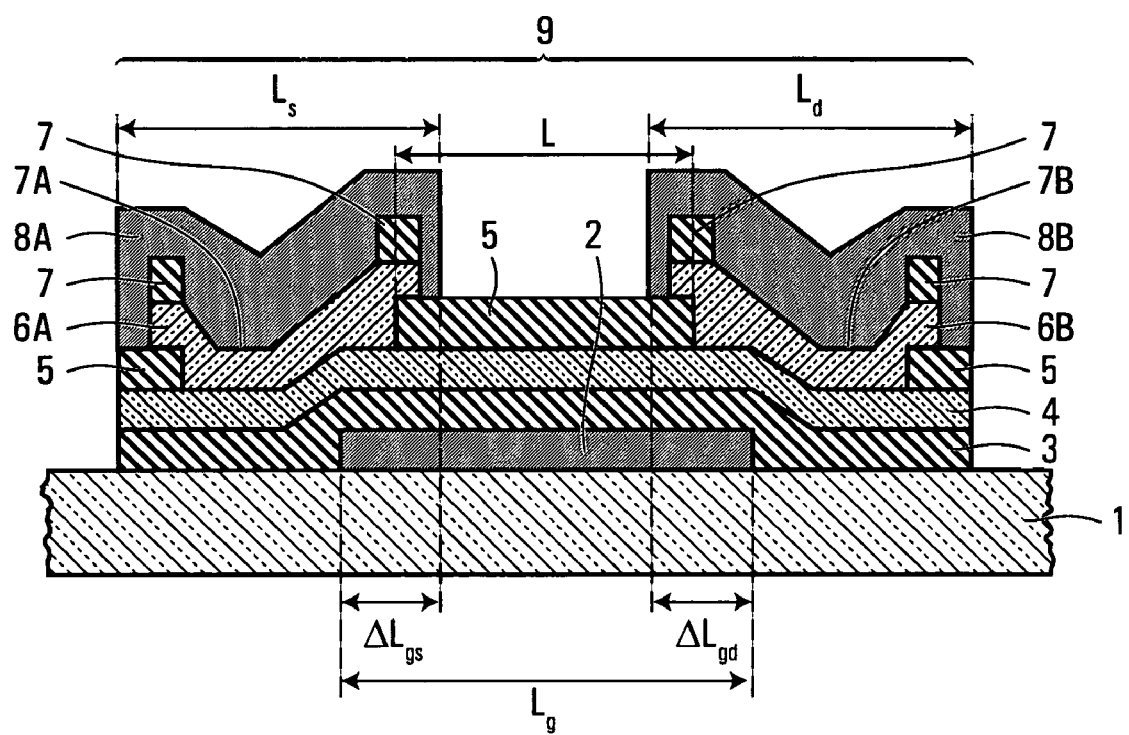
FIG. 1 illustrates a sectional view of a known lateral TFT.

A basic TFT 9 of the Inverted, staggered, bi-layer type is illustrated in FIG. 1. The basic TFT 9 is formed by a lateral (side-by-side) arrangement of a source electrode 8A, a drain electrode 8B and a gate electrode 2. A conducting channel, having a length L, may be controlled to extend, within an undoped semiconductor layer 4, between drain electrode 8B and source electrode 8A. The conductivity of the channel is controlled by the voltage applied to the gate electrode 2. The lateral TFT 9 is formed using conventional photolithography.

Specifically, fabrication of the lateral TFT 9 begins with the deposition of a metal film on a substrate 1. Substrate 1 may be, for instance, glass or plastic, while the metal film may be, for instance, molybdenum (Mo), chromium (Cr) or aluminum (Al). The metal film may then be patterned by conventional photolithography and etching to form the gate electrode 2.

Next, a consecutive deposition of a first insulating film 3, the undoped semiconductor layer 4 and a second insulating film 5 is performed. First insulating film 3 acts as a gate dielectric; undoped semiconductor layer 4 acts as an active layer; and second insulating film 5 acts as a first passivation dielectric. Gate dielectric 3 and second insulating film 5 may be, for instance, hydrogenated amorphous silicon nitride (a-SiN$_x$:H) or hydrogenated amorphous silicon oxide (a-SiO$_x$:H). The undoped semiconductor layer 4 may be, for instance, hydrogenated amorphous silicon (a-Si:H).

As will be understood by a person of ordinary skill in the art of thin film transistor fabrication, thin film semiconductors other than those mentioned above may be used in the fabrication of the lateral TFT 9. For instance, hydrogenated microcrystalline silicon (µc-Si:H), sometimes referred to as hydrogenated nanocrystalline silicon (nc-Si:H), and polysilicon (poly-Si) are suitable substitute materials for the above-mentioned material for the undoped semiconductor layer 4. Additionally, the thin film semiconducting material suggested above for the gate dielectric 3 and the second insulating film 5 may be considered merely exemplary and may be substituted by other dielectric and ohmic contact materials. Furthermore, semiconductors other than silicon may be considered.

The second insulating film 5 may then be patterned to define a source ohmic contact region and a drain ohmic contact region. After second insulating film 5 is patterned, an impurity-doped semiconductor film, such as n$^+$ a-Si:H, and a third insulating film 7 of the above mentioned insulating materials are consecutively deposited and patterned to form a source ohmic contact 6A in contact with the undoped semiconductor layer 4 and a drain ohmic contact 6B in contact with the undoped semiconductor layer 4. Here, the third insulating film 7 acts as a second passivation dielectric for the impurity-doped semiconductor film.

Next, second passivation dielectric 7 is patterned to form a source contact window 7A and a drain contact window 7B and the patterning is followed by the deposition and patterning of a highly conductive metal such as Al to form the source electrode 8A and the drain electrode 8B to complete the lateral TFT 9.

The source ohmic contact region is illustrated as having a length dimension $L_s$. Similarly, the drain ohmic contact region is illustrated as having a length dimension $L_d$. A channel length L is defined as the length of the second insulating film 5 between the source ohmic contact 6A and the drain ohmic contact 6B. Since certain lithographic alignment margins must be provided between masking steps to ensure 100% process yield, it is expected that there will be an overlapping region ($\Delta L_{gs}$) between a gate region ($L_g$) and a source region ($L_s$) and an overlapping region ($\Delta L_{gd}$) between the gate region ($L_g$) and a drain region ($L_d$).

The lateral TFT 9 operates as a field effect transistor (FET) in that the application of a voltage to the gate electrode 2 acts to modulate the conductance of a channel established in the undoped semiconductor layer 4 for current flow between the source electrode 8A and the drain electrode 8B. The operation principle of a TFT is virtually the same as a crystalline silicon CMOS FET in that the current-voltage characteristics of both types of transistor are given by $$I_{DS} = \frac{W}{L}\mu_{FE}C_i(V_{GS} - V_T)V_{DS} - \frac{1}{2}V_{DS}^2$$

in the linear region, i.e., for $V_{DS} < V_{GS} - V_T$, and $$I_{DS} = \frac{1}{2}\frac{W}{L}\mu_{FE}C_i(V_{GS} - V_T)^2$$

in the saturation region, i.e., for $V_{DS} \geq V_{GS} - V_T$. In these expressions, $I_{DS}$ is drain-to-source drive current, W is channel width, L is channel length, $\mu_{FE}$ is field-effect charge carrier mobility, $C_i$ is gate input (dielectric) capacitance per unit area, $V_{GS}$ is gate-to-source voltage, $V_T$ is a threshold voltage for charge carrier channel formation and $V_{DS}$ is drain-to-source voltage.

In addition, a source-drain transit time, $t_{sd}$, of a TFT is determined by three design parameters, in accordance with $$t_{sd} = \frac{L^2}{\mu_{FE}V_{DD}}$$

where L is channel length, $\mu_{FE}$ is field-effect mobility and $V_{DD}$ is supply voltage. A TFT fabricated with n+ source/drain ohmic contacts may be said to act as an n-channel (electron channel) TFT using electrons as charge carriers to produce a drive current. The electron channel is induced by applying a positive gate-to-source voltage, $V_{GS}$, above a finite positive threshold voltage, $V_T$. Alternatively, a TFT fabricated with p+ source/drain ohmic contacts may be said to act as a p-channel (hole channel) TFT using holes as charge carriers to produce a drive current. The hole channel is induced by applying a negative gate-to-source voltage, $V_{GS}$, below a finite negative threshold voltage, $V_T$.

n-channel TFTs are sometimes referred to as NMOS and p-channel TFTs are sometimes referred to as PMOS, and the combination of both NMOS and PMOS to build integrated circuits (IC) is referred to as Complementary MOS (CMOS), adopting the terminology used in the crystalline silicon CMOS technology. However, the field-effect mobility values for electrons and holes in non-crystalline semiconductors are significantly lower than those for crystalline semiconductors. For example, non-crystalline semiconductor a-Si:H has an electron mobility of about 1 $cm^2$ Ns and a hole mobility of less than 0.1 $cm^2$ Vs, while crystalline semiconductor crystalline silicon has an electron mobility of 1000 $cm^2$Ns and a hole mobility of 200 $cm^2$Ns. Therefore, NMOS a-Si:H TFTs are the only useful devices for active-matrix electronics, unless a viable method is provided to significantly shorten the channel length as an alternative solution to the low drive current and switching speed in PMOS a-Si:H TFTs. In order for a PMOS, a-Si:H, lateral TFT to be useful in display or imaging electronics, a nanoscale channel length, of 100 nm or less, is probably needed.

Figure 2:
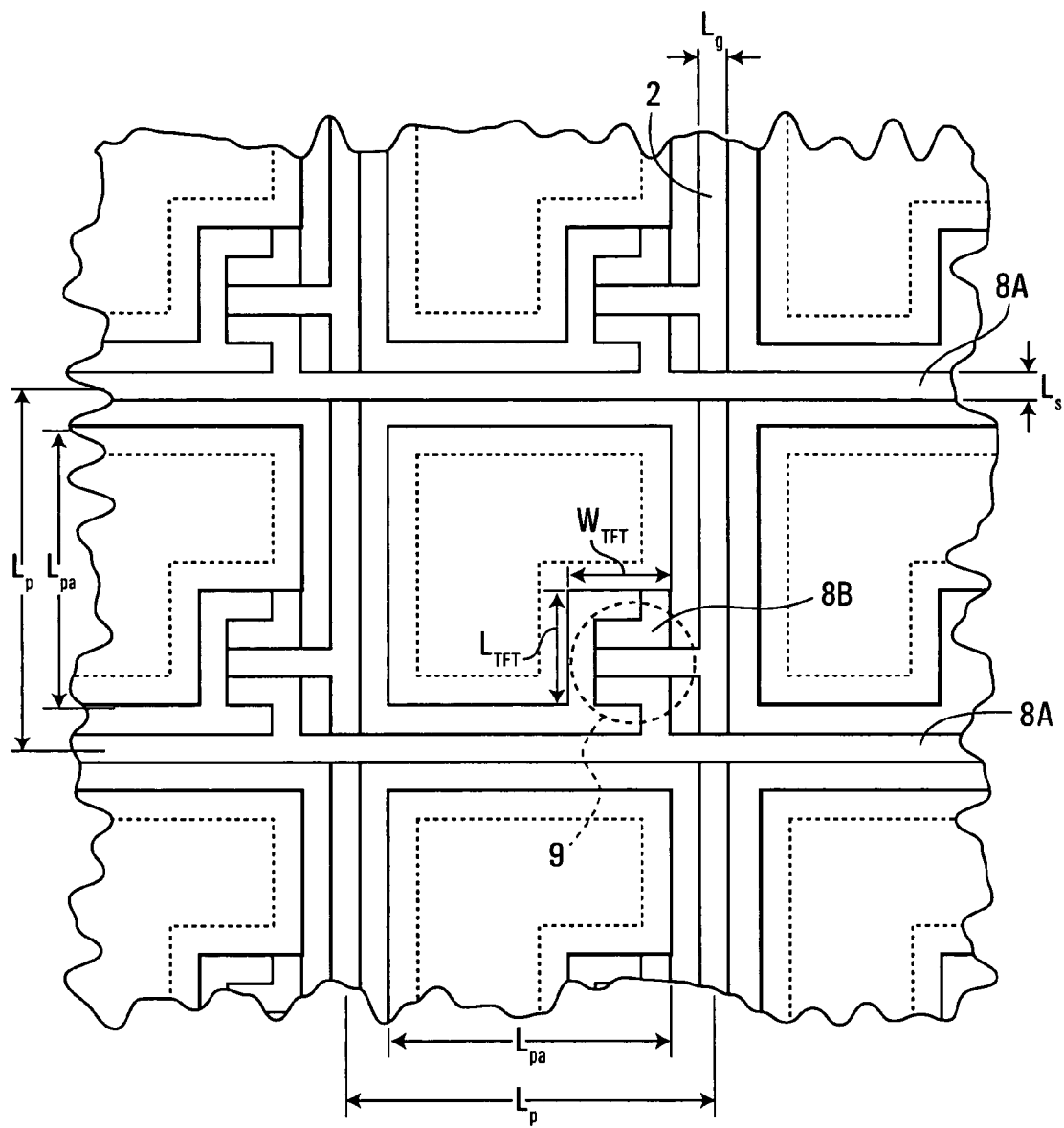
FIG. 2 illustrates a top plan view of an active-matrix including lateral TFTs such as those illustrated in FIG. 1.

An active-matrix backplane configuration, depicted in FIG. 2, is suitable for both AMLCD and optical/X-ray AMFPI. Multiple TFTs 9, including the gate line (integrated with the gate electrode 2), the data lines (integrated with the source electrode 8A) and pixel electrodes (integrated with the drain electrode 8B), can be fabricated by the aforementioned steps, except for one difference on the material and processing for the pixel electrodes between the two applications. For AMFPI, the pixel electrodes can be an opaque metal, such as Mo, Cr or Al, since related photodiode sensors are exposed to optical photons from the top of the panel. However, for AMLCD, the pixel electrodes are preferably a transparent conductor, such as indium tin oxide (ITO), since the pixel electrodes must allow a backlight to transmit through them with the overall pixel transmittance modulated by liquid crystal molecules.

Since the material (ITO) for the pixel electrodes is different from the material for the data lines, the process is slightly modified as follows. After source ohmic contact 6A and drain ohmic contact 6B are patterned, source contact window 7A and source metal 8A (data line) are patterned first. The drain contact window 7B and the transparent conductor for the drain (pixel) electrode 8B are subsequently patterned. After drain electrodes 8B are formed, the entire active-matrix backplane is passivated by a dielectric layer that is subsequently patterned with contact windows. Finally, for AMFPI, photodiode sensors are deposited and patterned above the drain electrodes 8B. For AMLCD, liquid crystals are injected into vacuum-sealed liquid crystal cells directly above the drain electrodes 8B.

The first drawback of the lateral TFT 9 is that the channel length (L), downward scaling of which is expected to increase switching speed and drive current of the lateral TFT 9, is limited by the precision in photolithography, to about 5 μm by the current flat-panel display industry standards. Lateral TFT switching performance is thus constrained by the precision in photolithography. Such a constraint undermines the use of a-Si:H TFTs in building peripheral circuitry for driving the active-matrix backplane. As a result, external crystalline silicon CMOS ICs and interfacing bond wires are required to implement peripheral drivers. Use of such external ICs and interfacing bond wires may complicate the manufacturing process and increase the manufacturing cost of active-matrix electronics.

The second drawback is that there are parasitic overlap capacitances due to the inevitable lithographic alignment margins. In particular, there is a parasitic gate-to-source overlap capacitance ($C_{gs}$) that occurs due to the overlapping region ($\Delta L_{gs}$) between the gate electrode 2 and the source electrode 8B. Additionally, there is a parasitic gate-to-drain overlap capacitance ($C_{gd}$) that occurs due to the overlapping region ($\Delta L_{gd}$) between the gate electrode 2 and the drain electrode 8B.

The third drawback is that, since the structure is lateral, the TFT size is relatively large. This is particularly disadvantageous when the TFT is used as a pixel switch in an active-matrix backplane, because part of the pixel area, i.e., the area bounded by the grid lines, is occupied by the TFT. FIG. 2 includes indications of dimensions such as a width ($W_{TFT}$) of the lateral TFT 9, a length ($L_{TFT}$) of the lateral TFT 9, a distance between the centers of the data lines 8A ($L_p$, which is expected to be identical to the distance between the centers of the gate lines 2) and a length of the pixel ($L_{pa}$). A fill factor, representative of a photosensitive area compared to a total pixel area, may be defined by the following expression:

$$f = \frac{L_{pa}^2 - (L_{TFT} \cdot W_{TFT})}{L_p^2}.$$

The fill factor may, alternatively, be called an aperture ratio, representative of an illuminative area compared to a total pixel area, of a display pixel. Unfortunately, any increases in the dimensions of the lateral TFT 9 result in reductions to the fill factor.

In the article, Uchida, Y. et al., Proposed vertical-type amorphous-silicon field-effect transistors, IEEE Electron. Device Lett., Vol. 5 (4), April 1984, pp. 105-107, a vertical TFT (i.e., a VTFT) cross-sectional structure (see FIG. 3) was proposed to eliminate the dependence of the channel length (L) on the photolithography technique.

Figure 3:
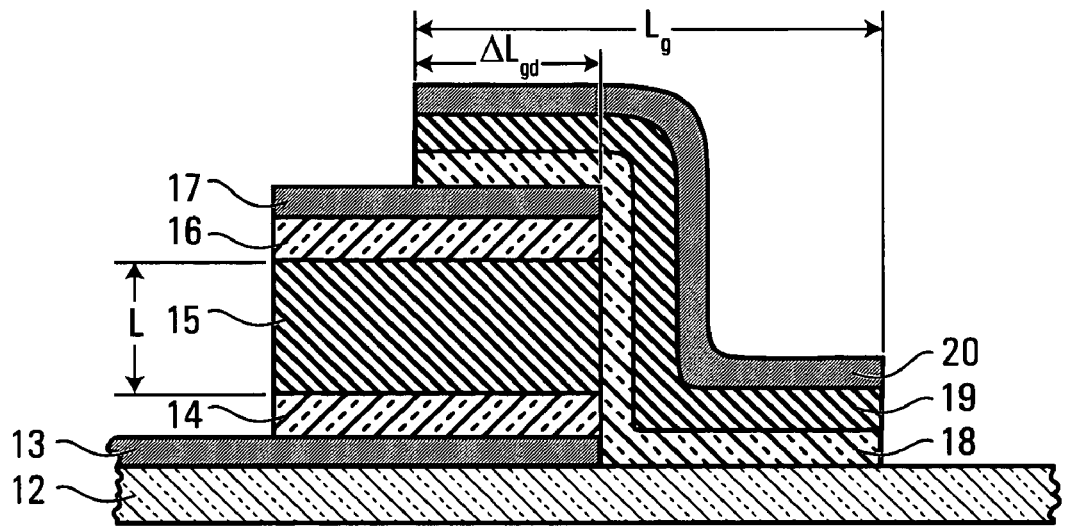
FIG. 3 illustrates a sectional view of a known vertical TFT.

In the VTFT of FIG. 3, onto a glass substrate 12 is deposited a molybdenum (Mo) source electrode 13. A first n+ a-Si layer 14 is deposited over the source electrode 13 followed by a dielectric (a-SiN$_x$:H) film 15, a second n+ a-Si layer 16 and a Mo drain electrode 17. Next, an undoped n− a-Si active layer 18 is deposited on the substrate 12 and part of drain electrode 17. On the active layer 18 is deposited a silicon nitride (SiN) gate insulator 19 and then gate electrode 20.

Dielectric film 15 and reactive ion etching are used to form a channel in the vertical direction in the VTFT of FIG. 3. Since the thickness of dielectric film 15 can be easily and precisely controlled, by deposition time, to 1 µm or less, a VTFT with submicron channel length is easily achievable. It can be shown that the VTFT of FIG. 3 has a significant switching speed improvement over a lateral TFT counterpart. Advantageously, VTFTs allow the building of peripheral circuitry directly on the panel to replace CMOS ICs and interfacing overheads and, thereby, allow for a reduction in manufacturing cost.

In overview, when fabricating TFTs in a vertical structure, the channel length is defined by the thickness of a particular one of the dielectric films, rather than by lithographic resolution, as is the case for fabricating TFTs in a lateral structure. Thus, the channel length can readily be scaled down below sub-micron dimensions by precisely controlling the film deposition time. Furthermore, it is proposed herein that the vertically stacked drain electrode, source electrode and gate electrode can be arranged in a strategic way, such that the whole TFT is contained in the intersectional area of the electrodes (5×5 µm² using the 5-µm lithographic technology). This method yields a relatively small TFT for any given lithographic resolution.

Presently, a high ON-OFF current ratio (~10⁸) and a low leakage current (~1 fA at V$_d$=1.5V) for 100-nm channel length and 5×5 µm² area a-Si:H TFTs can be successfully demonstrated with a design exemplary of the present invention, I. Chan and A. Nathan, "Amorphous Silicon Thin Film Transistors with 90° Vertical Nanoscale Channel," Appl. Phys. Lett., vol. 86, 253501, June 2005.

In a first drawback, however, the VTFT of FIG. 3 does not address a known TFT size issue in lateral TFTs for flat-panel electronics. Although it is generally understood that a TFT in vertical structure should occupy less area than a TFT in lateral structure, it is only implied that the TFT in vertical structure would occupy less pixel area. While reduced occupation of pixel area is desirable, it is preferable that the VTFT be designed in a particular structure so that the VTFT is hidden at the intersection of a gate line and a data line and, therefore, the VTFT does not occupy any pixel area.

A second drawback of the VTFT of FIG. 3 is the inherently large gate-to-source overlap capacitance (C$_{gs}$) and gate-to-drain overlap capacitance (C$_{gd}$), which are limiting factors for high speed switching, since the switching time delay is proportional to both the channel length and the gate input capacitance.

In a third drawback, the VTFT of FIG. 3 does not provide a method to suppress so-called short-channel effects. Short-channel effects are known to be common to field effect transistors (CMOS or TFT) with channel length of 1 µm or less.

Therefore, while the VTFT of FIG. 3 does provide a feasible way to fabricate a VTFT structure with a submicron channel, the detrimental issues of short-channel effects are not addressed. It may be shown that a VTFT structure with a submicron channel but without mechanisms to address the detrimental issues of short-channel effects cannot provide reliable electronic performance, especially when the channel length is reduced down to nanoscale dimensions. Due to a lack of a short-channel effect suppression mechanism, the known VTFT of FIG. 3 is expected to find limited applications in the building of reliable, low-power, high-speed, low-cost, nanoscale-channel TFT peripheral electronics that are required in high-resolution display devices, such as high-definition televisions (HDTV).

Figure 4:
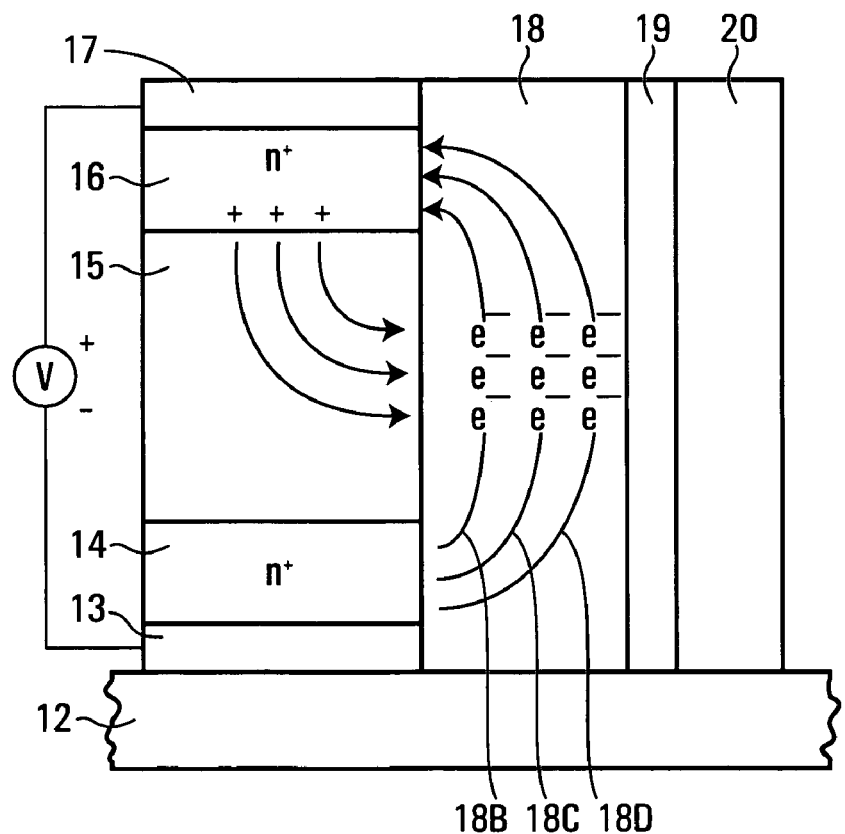
FIG. 4 schematically illustrates short-channel effects in a vertical thin film transistor such as the one illustrated in FIG. 3.

FIG. 4 schematically illustrates the VTFT of FIG. 3, including substrate 12, source electrode 13, first n+ a-Si layer 14, dielectric film 15, second n+ a-Si layer 16, drain electrode 17, undoped a-Si:H active layer 18, gate insulator 19 and gate electrode 20.

At least three short-channel effects can be identified, as illustrated in FIG. 4: a "back-gate" effect 18B, a space-charge-limited current (SCLC) effect 18C and a drain induced charge accumulation 18D. The "back-gate" effect 18B occurs due to a back-interface electron channel induced by a capacitive coupling 16B between the second n+ a-Si layer 16 and the undoped a-Si:H channel region 18. The SCLC effect 18C is also possible since the conduction of the trapped space charge through the undoped a-Si:H channel region 18 increases as the drain-to-source electrode spacing decreases or the drain-to-source voltage increases. The drain induced charge accumulation 18D, which is analogous to drain induced barrier lowering in crystalline silicon metal oxide semiconductor field effect transistors, can happen since the drain electric field accumulates electrons at the tail states of the undoped a-Si:H channel region 18 at the front interface and thereby induces higher drain current. These adverse effects should be suppressed to ensure high performance of the VTFT.

In a fourth drawback of the VTFT of FIG. 3, it is noted that a useful PMOS, a-Si:H VTFT having the structure proposed by the VTFT of FIG. 3 cannot be reliably achieved without effective suppression of short-channel effects. As such, the VTFT of FIG. 3 may only be useful as an NMOS transistor.

Figure 5:
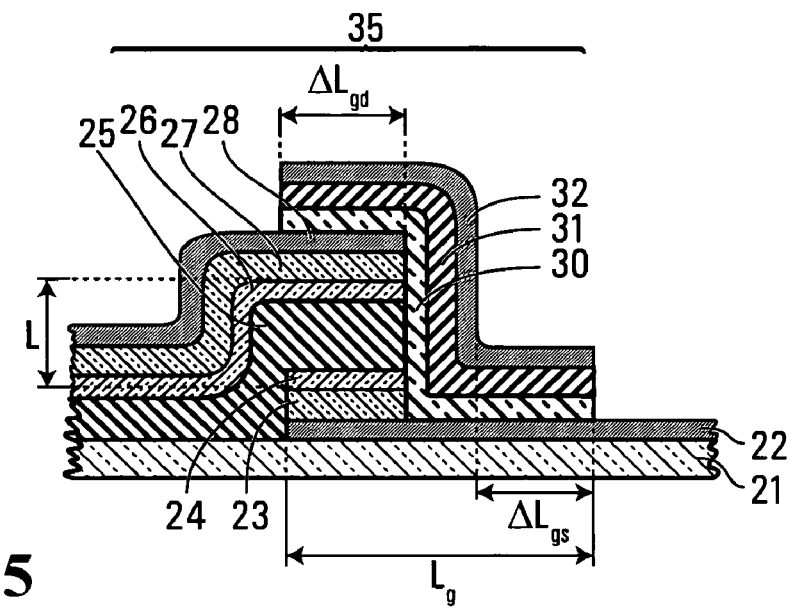
FIG. 5 illustrates a sectional view of a VTFT exemplary of an embodiment of the present invention.

In contrast to the known VTFT of FIG. 3, a VTFT 35 exemplary of an aspect of the present invention, as illustrated in FIG. 5, is designed to suppress short-channel effects. VTFT 35 has a substrate 21, a source electrode 22 and an n-type source ohmic contact layer 23 in common with the known VTFT of FIG. 3, referenced as elements 12, 13 and 14, respectively. Additionally, the VTFT 35 has a dielectric 25, an n-type drain ohmic contact layer 27 and a drain electrode 28 in common with the known VTFT of FIG. 3, referenced as elements 15, 16 and 17, respectively. Furthermore, VTFT 35 has an active layer 30, a gate insulator 31 and a gate electrode 32 in common with the known VTFT of FIG. 3, referenced as elements 18, 19 and 20, respectively. The VTFT 35 differs from the known VTFT of FIG. 3 in that between the source ohmic contact layer 23 and the dielectric 25 is a counter-doped (p-type) semiconductor layer 24 and between the drain ohmic contact layer 27 and the dielectric 25 is another counter-doped (p-type) semiconductor layer 26.

Herein, where it is said that a first semiconductor is doped in a manner counter to the manner in which a second semiconductor is doped, it should be understood that if the first semiconductor is doped to be n-type (i.e., where electrons are the majority charge carriers), then the second semiconductor is doped to be p-type (i.e., where holes are the majority charge carriers). Conversely, if the first semiconductor is doped to be p-type (i.e., where holes are the majority charge carriers), then the second semiconductor is doped to be n-type (i.e., where electrons are the majority charge carriers). Note that the relative concentration of charge carriers in the first semiconductor and the counter-doped second semiconductor is irrelevant to the condition of being counter-doped.

As will be discussed, p-type semiconductor layers 24, 26 that separate the n-type ohmic contact layers 23, 27 from the dielectric 25 act to suppress the short-channel effects observed in the known VTFT of FIG. 3.

Figure 9A:
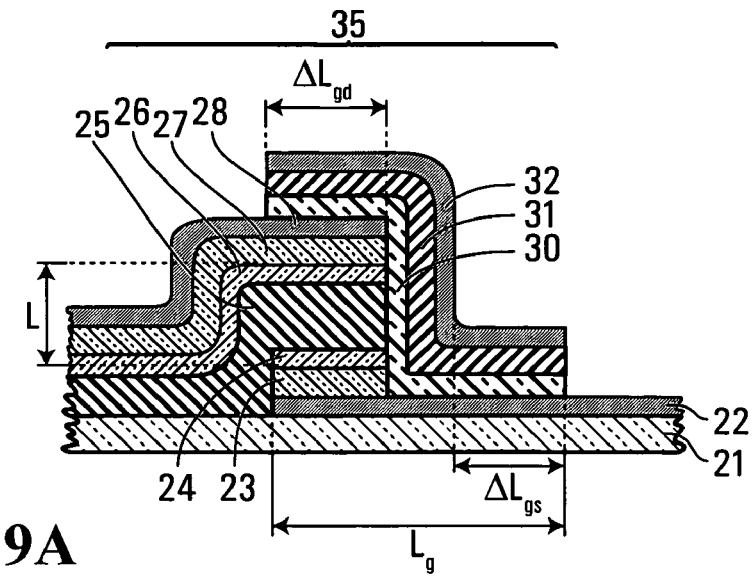
FIG. 9A illustrates a sectional view of a gate portion, the drain portion and the source portion in a stage of the fabrication the VTFT of FIG. 5.
Figure 9B:
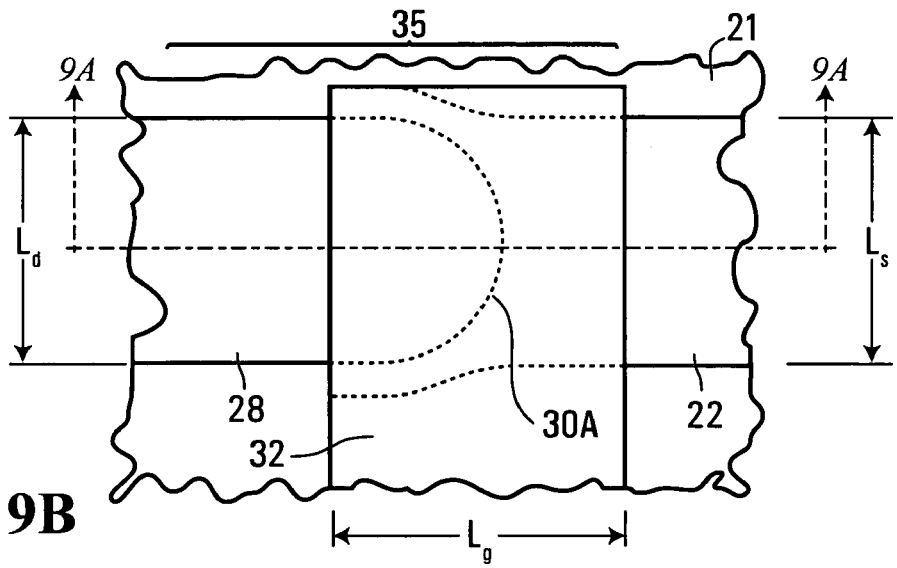
FIG. 9B illustrates a top plan view of the gate, source and drain portions of FIG. 9A with the semi-circular channel geometry.
Figure 9C:
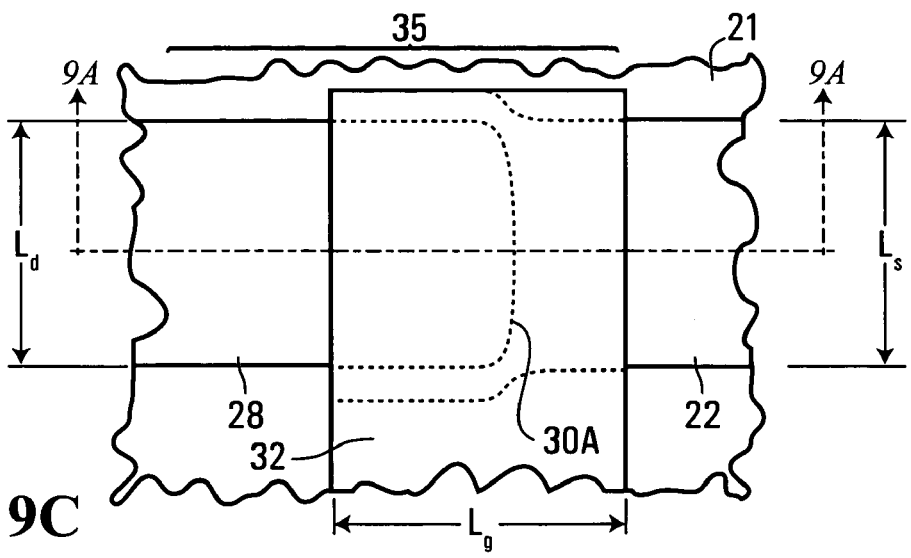
FIG. 9C illustrates a top plan view of the gate, source and drain portions of FIG. 9A with the round-cornered, rectangular channel geometry.

In the VTFT 35 as illustrated in FIGS. 9B and 9C, the source electrode 22 and the drain electrode 28 are patterned with an overlapping region at their ends and non-overlapping extensions in the opposite directions. Then, the gate electrode 32 is patterned in an direction generally orthogonal to the direction of the source electrode 22 and the drain electrode 28, to form an intersection at their overlapping region. The VTFT 35 is thereby formed at the intersection of the three electrodes 22, 28, 32. Each of the electrodes 22, 28, 32 is patterned by a separate mask step to allow layout flexibility of forming the VTFT 35 with a minimized drain-source overlapping area. The VTFT 35, thus formulated, is considered relatively small. Whether the known VTFT of FIG. 3 can form such a relatively small TFT is unknown. Additionally, it may be considered that the known VTFT of FIG. 3 does not have the flexibility to form the drain-source overlapping area only at the ends of the drain electrode 17 and the source electrode 13 since the drain-source multi-layered structure is formed by one mask step, rather than by two, separate, mask steps.

Figure 8A:
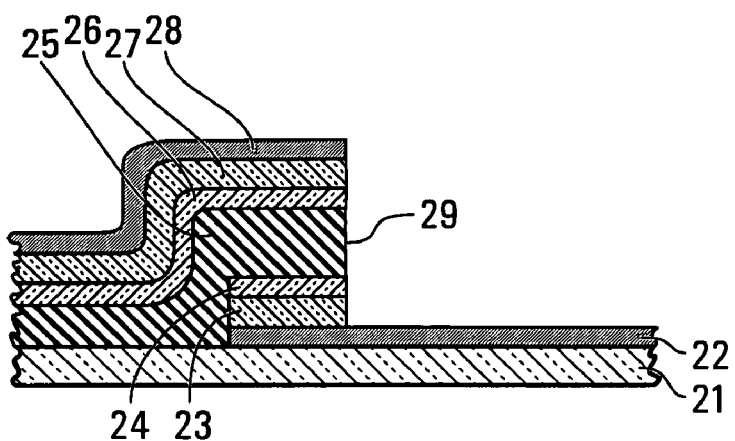
FIG. 8A illustrates a sectional view of a drain portion and the source portion in a stage of the fabrication the VTFT of FIG. 5.
Figure 8B:
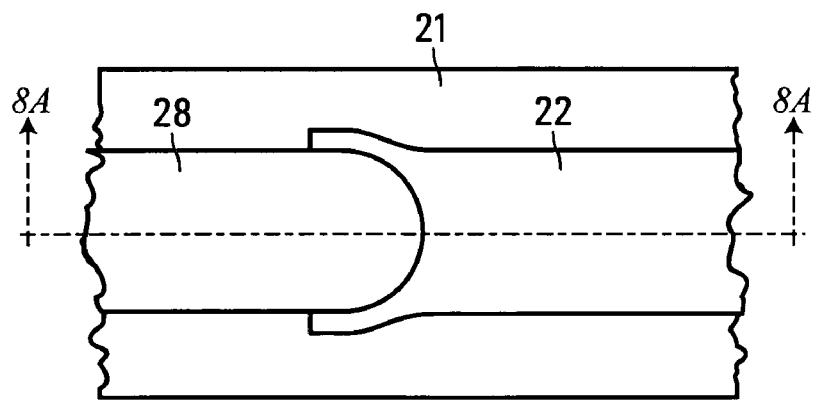
FIG. 8B illustrates a top plan view of the source and drain portions of FIG. 8A with the semi-circular channel geometry.
Figure 8C:
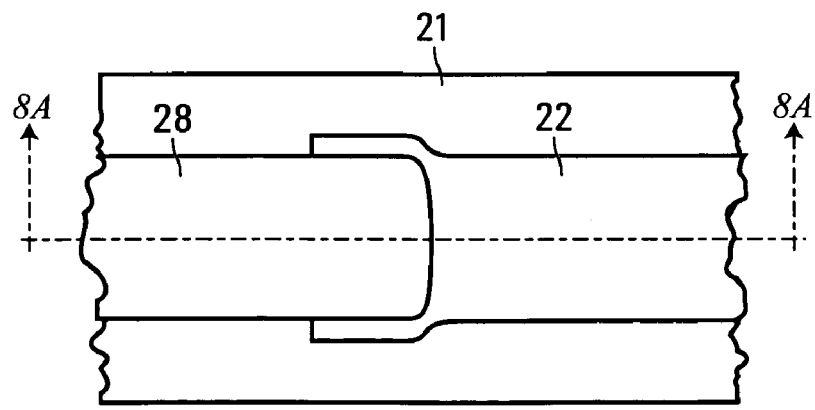
FIG. 8C illustrates a top plan view of the source and drain portions of FIG. 8A with the round-cornered, rectangular channel geometry.

A unique channel width scaling concept is illustrated in FIGS. 8B and 8C. Demonstrative of the channel width scaling concept, a semi-circular channel geometry is illustrated in FIG. 8B and a round-cornered, rectangular channel geometry is illustrated in FIG. 8C. Since the channel width is defined by the perimeter dimension of the drain electrode 28, the channel width is scalable by changing the channel geometry while maintaining a constant TFT size.

To suppress the short-channel effects that usually appear in submicron channel TFTs the(as well as in crystalline Si MOSFETs), a sandwiched structure of $p^+$/dielectric/$p^+$ 24, 25, 26 (see FIG. 5) for n-channel VTFT (also $n^+$/dielectric/$n^+$ for p-channel VTFT) is used instead of the channel-length-defining dielectric 25 alone. For more information on the suppression of short-channel effects, see K. Roy, S. Mukhopadhyay, and H. Mahmoodi-Meimand, "Leakage Current Mechanisms and Leakage Reduction Techniques in Deep-Submicrometer CMOS Circuits," Proc. IEEE, vol. 91, no. 2, February 2003.

Figure 6:
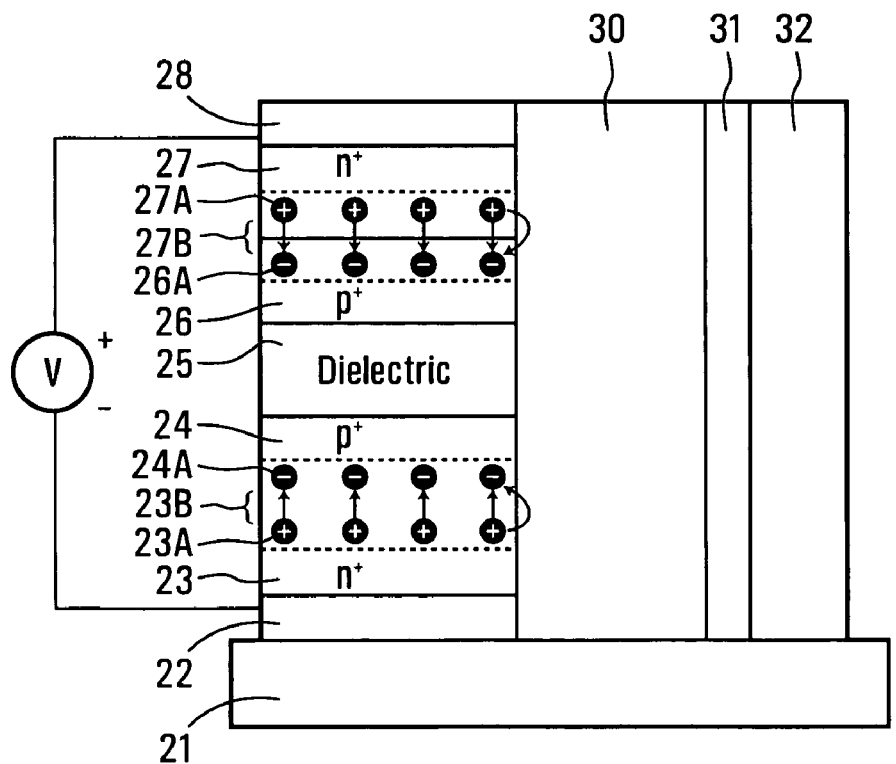
FIG. 6 illustrates the VTFT of FIG. 5 in a generic schematic to illustrate mechanisms for suppressing short-channel effects

For clarity, the VTFT 35 of FIG. 5 is redrawn in a generic operational schematic in FIG. 6 to illustrate the mechanisms for suppressing short-channel effects. Notably, there is a source internal electric field 23B built up at the junction between the $n^+$ source ohmic contact layer 23 and the $p^+$ source short-channel effect (SCE) suppression layer 24 as well as a drain internal electric field 27B built up at the junction between the $p^+$ drain SCE suppression layer 26 and the $n^+$ drain ohmic contact layer 27. Additionally, there is an immobile space charge region 23A in the source ohmic contact layer 23, an immobile space charge region 24A in the source SCE suppression layer 24, an immobile space charge region 26A in the drain SCE suppression layer 26 and an immobile space charge region 27A in the drain ohmic contact layer 27.

It is expected that increasing drain voltage bias changes the internal electric fields 23B, 27B by varying the immobile space charge regions 23A, 24A, 26A and 27A. As a result, the source internal electric field 23B and the drain internal electric field 27B are more confined in the p-n junctions. Due to this confinement of the internal electric fields 23B, 27B, the short-channel effects may be considered to have been suppressed.

An exemplary process to produce the n-channel (NMOS) VTFT 35 starts with the substrate 21 (see FIG. 7A) that is designed for use in the manufacture of active-matrix, flat-panel electronics. For example, glass and plastic are commonly used in such an application.

Mask 1.1

First, a non-refractory metal film, such as chromium (Cr) or aluminum (Al), is deposited onto the substrate 21 at room temperature, for example, by sputter deposition or evaporation techniques, for use as the source electrode 22. Thickness of this metal film is typically 100 nm, but this dimension is not critical.

Then, a heavily-doped, n-type semiconductor film, such as hydrogenated amorphous silicon ($n^+$ a-Si:H), hydrogenated microcrystalline silicon ($n^+$ μc-Si:H) or polysilicon ($n^+$ poly-Si), is deposited onto the source electrode 22 to act as the source ohmic contact layer 23. In the case of $n^+$ a-Si:H and $n^+$ μc-Si:H for an n-channel VTFT, the source ohmic contact layer 23 may, for example, be deposited by the known plasma-enhanced chemical vapor deposition (PECVD) technique with about 1% phosphine ($PH_3$) additive gas in silane ($SiH_4$) parent gas, sometimes also with $H_2$ gas, in a vacuumed plasma environment. Notably, $n^+$ poly-Si can be made by excimer laser annealing (ELA) processing of an $n^+$ a-Si:H film. Other techniques are also capable of, and readily available for, $n^+$ a-Si:H, $n^+$ μc-Si:H and $n^+$ poly-Si film fabrication.

In the PMOS case, a $p^+$ source ohmic contact layer 23 may be deposited by the PECVD technique with about 10% diborane ($B_2H_6$) additive gas in silane ($SiH_4$) parent gas in a vacuumed plasma environment.

The material used for the source ohmic contact layer 23 is preferably, though not necessarily, μc-Si:H due to the higher electrical conductivity of μc-Si:H in relation to a-Si:H and the simpler process conditions in relation to poly-Si. However, poly-Si has the highest electrical conductivity among the mentioned ohmic contact materials and can be used when manufacture complication is not a concern. It has been found that the thickness of the ohmic contact layer 23 can be in the range from 100 to 300 nm without causing serious issues in the substrate topography.

After the depositing of the ohmic contact layer 23, a heavily-doped, p-type semiconductor layer (5-20 nm), such as $p^+$ a-Si:H, is deposited, for example, by PECVD, to act as a SCE suppression layer 24.

This p-type semiconductor layer 24 need not be highly conductive as for the ohmic contact layer 23 and may, for example, be deposited by the known PECVD technique with about 10% diborane ($B_2H_6$) additive gas in silane ($SiH_4$) parent gas, sometimes also with $H_2$ gas, in a vacuumed plasma environment.

Figure 7A:
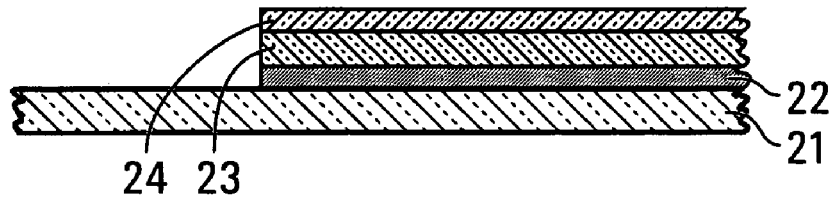
FIG. 7A illustrates a sectional view of a source portion in a stage of the fabrication of the VTFT of FIG. 5.
Figure 7B:
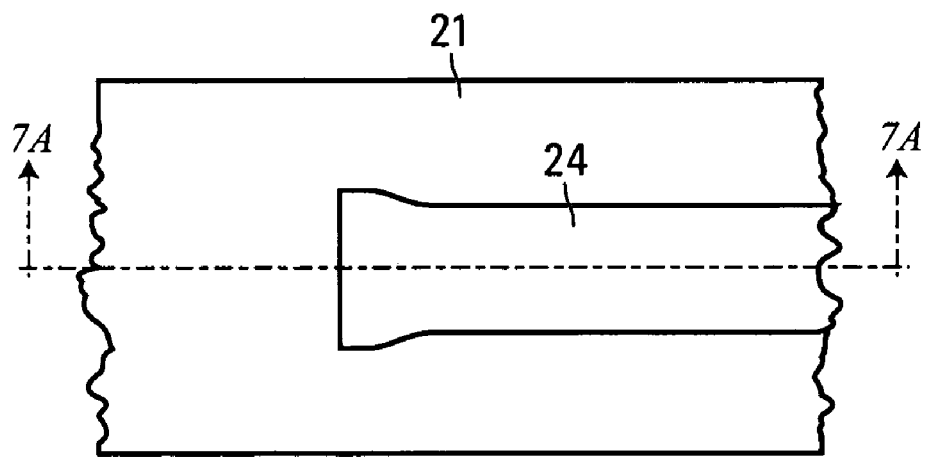
FIG. 7B illustrates a top plan view of the source portion of FIG. 7A with a first end configuration exemplary of an embodiment of the present invention.
Figure 7C:
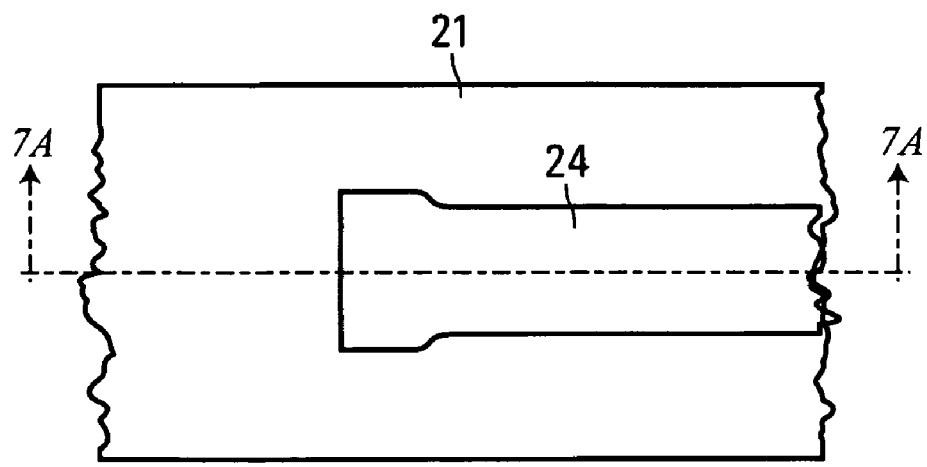
FIG. 7C illustrates a top plan view of the source portion of FIG. 7A with a second end configuration exemplary of an embodiment of the present invention.

Once the source SCE suppression layer 24 has been deposited, the three layers deposited on the substrate 21 may be etched to take the shape represented in FIG. 7B or, alternatively, the shape represented in FIG. 7C.

It is known to define a photoresist pattern for use in a process called photolithography. In photolithography, a layer of photoresist—a chemical that undergoes some wavelength-specific radiation-sensitive chemical reactions when exposed to light—is applied on top of a device being fabricated. The photoresist is then selectively exposed to illumination in specific places. For this purpose, a transparent plate with a photoresist pattern printed on it, called a photomask, is used together with an illumination source. Light from the illumination source is allowed to shine through the photomask onto the specific places on the photoresist. The exposed photoresist becomes more soluble in a solvent developer (in the case wherein the photoresist is a "positive" photoresist). In a subsequent etching process, the photoresist is then "developed" by exposing the photoresist to the solvent that removes the exposed photoresist. As such, the specific places on the photoresist, and the layers of material under the specific places of the photoresist, are etched away by the etchant.

Thus, a photoresist pattern may be used as a mask for the etching of the structure of FIG. 7A to remove the ohmic contact layer 23 and the source SCE suppression layer 24 from a portion of the source electrode 22. Wet etching or plasma etching, particularly reactive ion etching (RIE), can be used for etching the source SCE suppression layer 24 and the source ohmic contact layer 23. The wet etchant may, for instance, be a potassium hydroxide (KOH) solution, while the plasma etchant may, for instance, be a fluorine-based plasma (e.g., $CF_4$, $CF_4/H_2$, $CHF_3$), chlorine-based plasma (e.g., $CF_3Cl$, $CCl_4$, $BCl_3$) or a bromine-based plasma (e.g., HBr, $CF_3Br$) with appropriate vacuum process conditions. RIE is a more favorable etching technique, simply because of the anisotropic (directional) nature of RIE that provides for better linewidth control. However, it may be considered that precision on anisotropy is not important in this step (Mask 1.1). The Cr film underneath the patterned $n^+$ a-Si:H or $n^+$ µc-Si:H film may be etched by a Cr wet etchant, for example, $Cr(NH_4)_2(NO_3)_6+CH_3COOH+H_2O$, or a chlorine-based $(Cl_2/O_2)$ plasma. If the electrode material is Al instead of Cr, another wet etchant, for example, $H_2PO_3+CH_3COOH+HNO_3+H_2O$, or the chlorine-based (e.g., $Cl_2/BCl_3$) plasma etchant may be used for etching.

Finally, the photoresist may be stripped away by a conventional stripper solution or an oxygen-based plasma (e.g., $O_2$, $O_2/CF_4$) to ready the structure for the next film deposition sequence.

As illustrated in FIG. 8A, the etching of the source SCE suppression layer 24 and the $n^+$ source ohmic contact layer 23 leaves a relatively small region around which to build the remainder of the VTFT.

Mask 1.2

The dielectric film 25, such as hydrogenated amorphous silicon nitride (a-$SiN_x$:H), hydrogenated amorphous silicon oxide (a-$SiO_x$:H) or hydrogenated amorphous silicon oxynitride (a-$SiO_xN_y$:H), is then deposited (see FIG. 8A), for example, by PECVD, to act as a channel-defining dielectric between the source electrode 22 and a yet-to-be-deposited drain electrode. Precise control of the thickness of the channel-defining dielectric film 25, for example, by deposition time, allows for an accurate definition of the channel length (L) in submicron or nanoscale dimensions. Using current deposition techniques, the thickness of the channel-defining dielectric film 25 can be practically controlled from 25 to 1000 nm.

Another p-type semiconductor film (5-20 nm), such as $p^+$ a-Si:H, is then deposited to be a drain SCE suppression layer 26.

Next, another 100-300 nm $n^+$ a-Si:H, µc-Si:H, or poly-Si film is deposited to act as the drain ohmic contact layer 27.

Another 100-200 nm non-refractory metal (Cr or Al) film is subsequently deposited as the drain electrode 28.

Using photoresist as a mask, the metal/$n^+$/$p^+$/dielectric/$p^+$/$n^+$ multi-layered structure is etched to shape the drain. Initially, the metal film that forms the drain electrode 28 may be etched either by wet or plasma etchants. Subsequently, it is expected that the underlying layers 27, 26, 25, 24, 23 will be etched by RIE. The drain electrode 28 may serve as a self-aligned mask for the RIE process. Careful control of the anisotropy of the RIE process advantageously provides a surface 29 that is both flat and vertical.

It has been found that, ideally, for a reliable VTFT structure completed by later film deposition processes, the surface 29 is flat and vertical, as illustrated in FIG. 8A. The surface 29 may, however, be less than flat and less than vertical without sacrificing functionality.

From the top view presented in FIG. 8B and the alternative top view presented in FIG. 8C, two alternatives for channel geometry may be noted, including a semi-circular channel geometry (FIG. 8B) and a round-cornered, rectangular channel geometry (FIG. 8C). These channel geometries are designed to provide for channel width scalability while keeping the TFT size exactly the same.

Using 5-µm lithography, a semi-circular channel may define a channel width of 7.85 µm ($W_c=\frac{1}{2}(2\times\pi\times 2.5)=7.85$ µm), whereas a round-cornered, rectangular channel may define a channel width of 9.14 µm ($W_{rcr}=\frac{1}{2}(2\times\pi\times 1)+3+2(1.5)=9.14$ µm), where it is assumed that the round corners have a 1-µm radius and the drain electrode 28 is aligned to the mid-linewidth of the gate electrode 22.

Mask 1.3

An undoped semiconductor film, such as undoped a-Si:H, µc-Si:H or poly-Si, is then deposited (see FIG. 9A) onto the vertical structure illustrated in FIG. 8A, for example, by PECVD, to serve as the active layer 30. The thickness of the active layer 30 should be of the order of 50 nm, or less, to reduce the leakage current due to space-charge-limited current (SCLC) during the off-state of the VTFT structure. SCLC is a bulk effect and can be effectively suppressed by reducing the thickness of the active layer 30.

Then, the gate dielectric film 31, which may, for example, be a-$SiN_x$:H, a-$SiO_x$:H, hydrogenated amorphous silicon oxynitride (a-$SiO_xN_y$:H) or tantalum oxide ($Ta_2O_5$), and the gate electrode 32, which may, for example, be 100-300 nm non-refractory metal (Cr or Al), are sequentially deposited and patterned using photoresist to form a vertical gate structure. The thickness of the gate dielectric film 31 should be scaled according to the channel length to provide sufficient gate control of the channel, but may be roughly in the range of 25 to 250 nm. The high-k dielectric, $Ta_2O_5$, may be used as the gate dielectric film 31 to obtain high drive current with thicker dielectric and to avoid high gate leakage current due to electron tunneling.

The etching process in this case should be isotropic (non-directional) because the unmasked portion of the gate materials on the sidewall surfaces can only be etched by lateral etching. Wet etching techniques can be used here because of the isotropic nature of chemical etching. Isotropic plasma etching can also be used to achieve the same result. It is also known that isotropic etching can be achieved by operating the RIE process in the isotropic regime. Other plasma excitation methods, such as inductively coupled plasma (ICP), can also be used to enhance the isotropy. After this, an NMOS VTFT 35 may be considered complete. The last two masks are for device passivation and final metallization for interconnections.

The exemplary VTFT 35 is an NMOS VTFT. However, a similar PMOS VTFT would be fabricated with the source ohmic contact layer 23 and the drain ohmic contact layer 27 formed of a p-type semiconductor material and the counter-doped semiconductor layers 24, 26 formed of an n-type semiconductor material.

FIG. 9B illustrates a top plan view of the gate, source and drain portions of FIG. 9A with the semi-circular channel geometry. FIG. 9C illustrates a top plan view of the gate, source and drain portions of FIG. 9A with the round-cornered, rectangular channel geometry.

Mask 1.4

A 100-300 nm a-SiN$_x$:H or a-SiO$_x$:H dielectric film is then deposited on the VTFT 35, for example, by PECVD, to serve as a passivation layer 33 (see FIG. 10) for electrical isolation and an etch-stop layer for final metallization or interconnections. In some cases, low-k dielectric materials, such as benzocyclobutene (BCB) liquid-based photopolymer, are desirable to reduce capacitive coupling between metal lines as well as serving as a planarization layer to minimize substrate topography. The process technology for BCB is basically the same as, or very similar to, photoresist lithography. At a certain distance away from the critical features of the VTFT 35, the passivation layer 33 is patterned with a drain contact window 33A and a source contact window 33B to uncover a portion of the drain electrode 28 and a portion of the source electrode 22, respectively, for making electrical connection with interconnections. Though not shown, the passivation layer 33 may also be patterned with a contact window to uncover a portion of the gate electrode 32. Wet or plasma etchants may be considered suitable for this patterning task.

Mask 1.5

Figure 10:
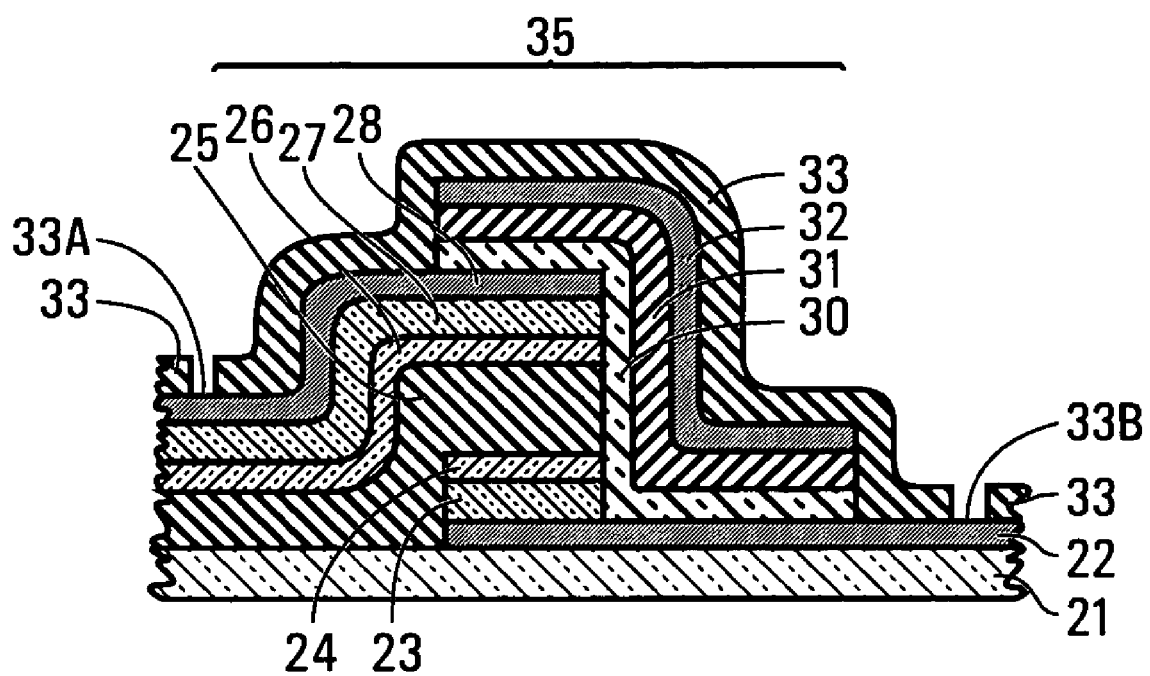
FIG. 10 illustrates a sectional view of the VTFT of FIG. 9A with the addition of a passivation layer.
Figure 11:
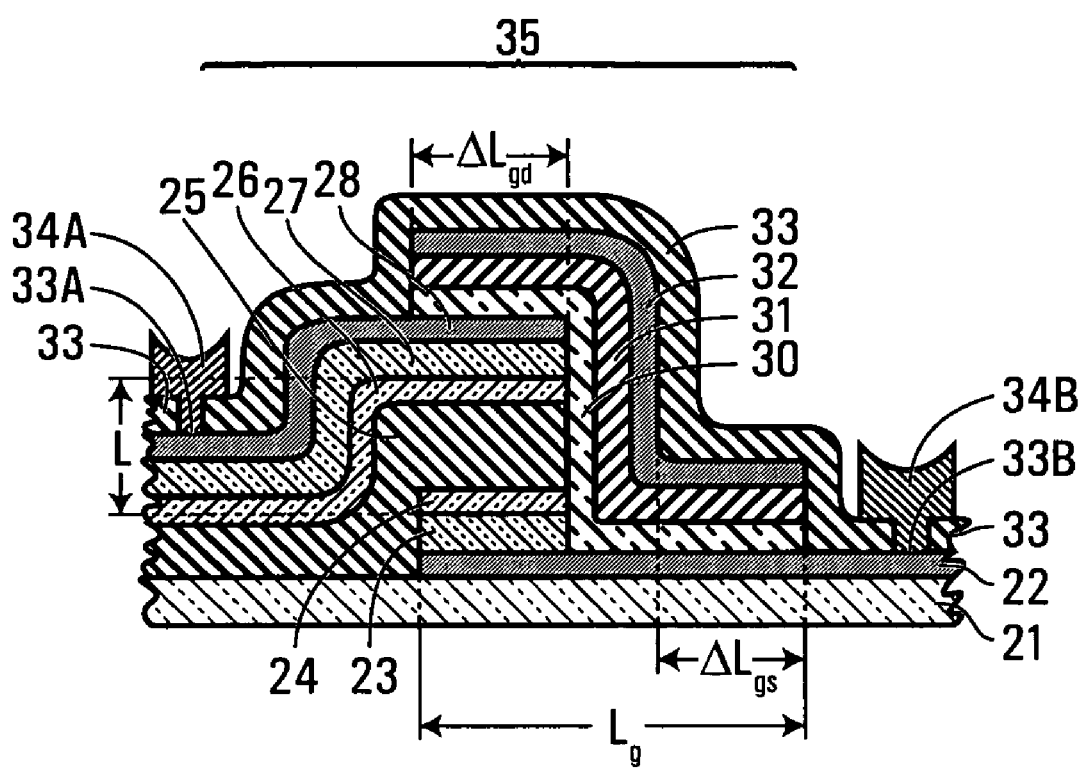
FIG. 11 illustrates a sectional view of the VTFT of FIG. 10 with the addition of a drain interconnect and a source interconnect.

A highly conductive metal film, such as aluminum (Al), is then deposited (see FIG. 11) on the VTFT 35 of FIG. 10, for example, by sputter deposition or evaporation, to function as the final metal or interconnections. The thickness of the metal film is preferably between 100 nm and 1 μm and is dependent on design considerations, such as electrical resistance limits and manufacturing process requirements. Wet or plasma etchant can be used to pattern the metal film into a drain interconnect 34A and a source interconnect 34B to complete the fabrication a VTFT 35 according to an aspect of the present invention.

Figure 12:
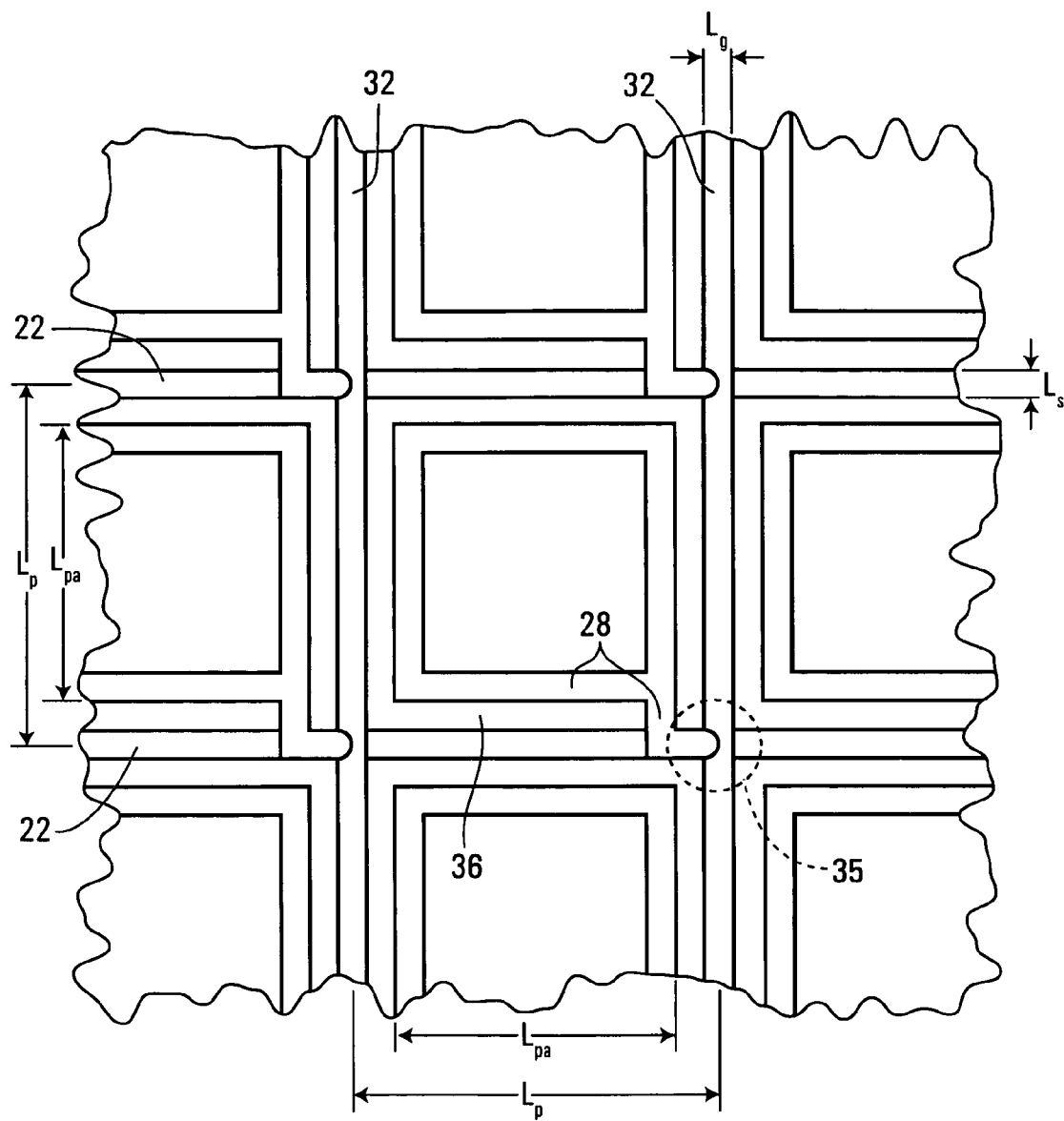
FIG. 12 illustrates a top plan view of an exemplary AMFPI backplane fabricated using the VTFT of FIG. 5.

An active-matrix backplane may be created by integrating a plurality of VTFT devices having a structure exemplified by the VTFT 35. As mentioned above, TFT devices may be arrayed to form an AMFPI backplane or an AMLCD backplane. In active-matrix backplane integration, the manufacturing process for an array of VTFT devices is slightly different than the process, discussed with reference to FIGS. 7A-11, for fabricating a single VTFT device having the VTFT 35. The process for fabricating an AMFPI backplane is completed after Mask 1.4, wherein the passivation layer 33 is deposited. A portion of an exemplary AMFPI backplane is illustrated in FIG. 12, before the passivation layer 33 is deposited. The AMFPI backplane of FIG. 12 includes areas 36 (bounded by the source electrode lines 22 and the gate electrode lines 32) representative of areas for installation of photodiode sensors.

In general, an active-matrix backplane may be created by intersecting m gate electrode lines 32 with n source electrode lines 22 at m×n intersections while m×n drain electrode lines 28 are arranged such that a drain electrode line is associated with each of the m×n intersections. In doing so, a VTFT having the structure exemplified by the VTFT 35 may be formed at each intersection. In FIG. 12, m=2, n=2 and m×n=4.

For an AMLCD backplane (FIG. 13), however, extra material is used, along with an extra photomask step between Mask 1.3 and Mask 1.4, to form a transparent pixel electrode 37. The material for the transparent pixel electrode 37 may be, for example, indium tin oxide (ITO). A layer of ITO may be deposited, in part onto the drain electrode 28 in the VTFT 35 (see FIG. 13), to a thickness of around 100 nm. The ITO layer may then be etched to pattern a structure for the transparent pixel electrode 37. Next, the passivation layer 33 may deposited and a set of contact windows may be patterned in the passivation layer 33 to complete the process. The AMLCD backplane of FIG. 13 includes areas 39 representative of areas for installation of liquid crystal. Therefore, in total, five photomask steps are needed for a generalized AMLCD backplane.

An ITO layer is typically etched by an HCl solution. However, in this exemplary process sequence, it may be shown that HCl cannot provide the necessary etch selectivity between ITO and the underlying metal layers. Therefore, it is preferred to etch the ITO layer with a plasma etchant, such as CH$_4$/H$_2$, which can provide much better process control and material selectivity.

Alternatively, the ITO layer may be used for both the drain electrode 28 and the pixel electrode 37, in which case the ITO layer may be deposited by radio frequency magnetron sputtering and patterned by a plasma etchant. Accompanying such an approach, rather than the 100-300 nm n$^+$ a-Si:H, μc-Si:H, or poly-Si film, a thinner (30-50 nm), high transparency, doped semiconductor may be deposited, in the Mask 1.2 process, to act as the drain ohmic contact layer 27. Advantageously, using the ITO layer for both the drain electrode 28 and the pixel electrode 37 eliminates the requirement for an extra mask to pattern the pixel electrode 37 and provides pixel aperture transmittance.

Other process modifications, not described here, can equally be implemented to give the same VTFT active-matrix design structure with similar or lower manufacturing cost and process complexity while meeting the design concept of a fill factor that is independent of TFT size.

Figure 14:
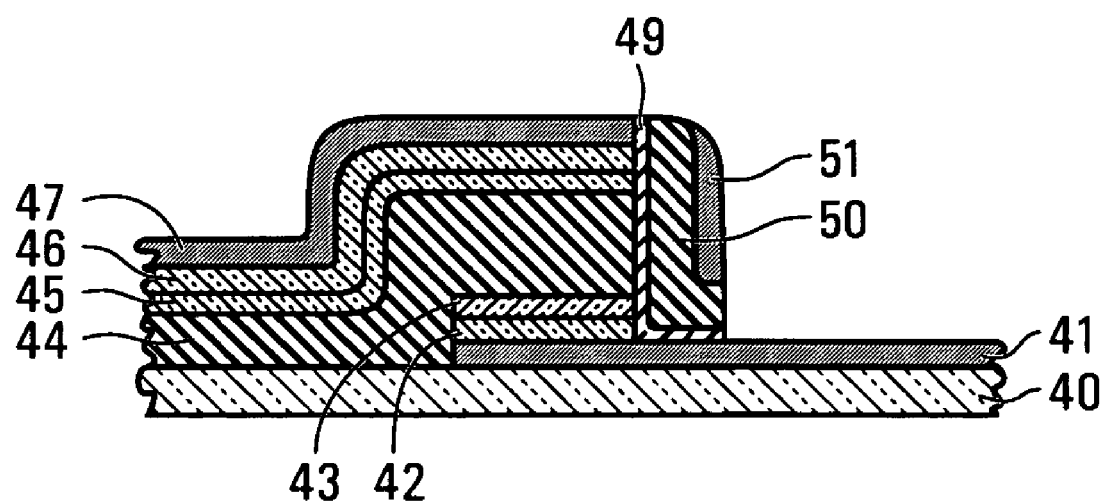
FIG. 14 illustrates a sectional view of the a VTFT exemplary of another embodiment of the present invention.

The VTFT 35 of FIG. 5 may be modified to produce a VTFT 54, illustrated in section in FIG. 14, exemplary of another aspect of the present invention.

The VTFT 54, as illustrated in FIG. 14 has a substrate 40 and a source structure including a source electrode 41, an n-type source ohmic contact layer 42 and a counter-doped (p-type) semiconductor layer 43. Additionally, the VTFT 54 has a dielectric 44 and a drain structure including a drain electrode 47, an n-type drain ohmic contact layer 46 and counter-doped (p-type) semiconductor layer 45. Furthermore, the VTFT 54 has an active layer 49, a gate insulator 50 and a gate electrode 51.

To minimize gate-to-source overlap capacitance ($C_{gs}$) and gate-to-drain overlap capacitance ($C_{gd}$), the VTFT 35 of FIG. 5 may be modified to minimize the region ($\Delta L_{gs}$) wherein the gate electrode 32 overlaps the source electrode 22 and to minimize the region ($\Delta L_{ds}$) wherein the gate electrode 32 overlaps the drain electrode 28. In the VTFT 54, illustrated in FIG. 14, the active channel 49, the gate dielectric 50 and the gate electrode 51 do not overlap with the drain electrode 47, thus the gate-to-drain overlap capacitance is minimized. Although there is some vertical overlap, the active channel 49, the gate dielectric 50 and the gate electrode 51 do not laterally overlap the source electrode 41, thus, the gate-to-source overlap capacitance is minimized.

Figure 15A:
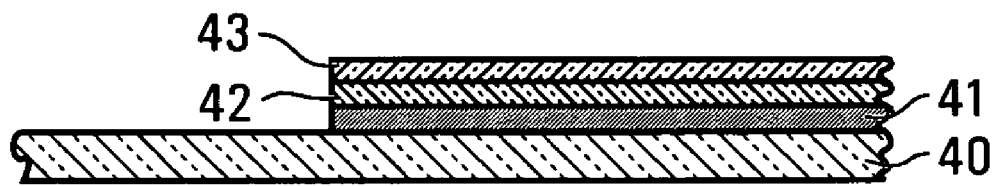
FIG. 15A illustrates a sectional view of a source portion in a stage of the fabrication of the VTFT of FIG. 14.
Figure 15B:
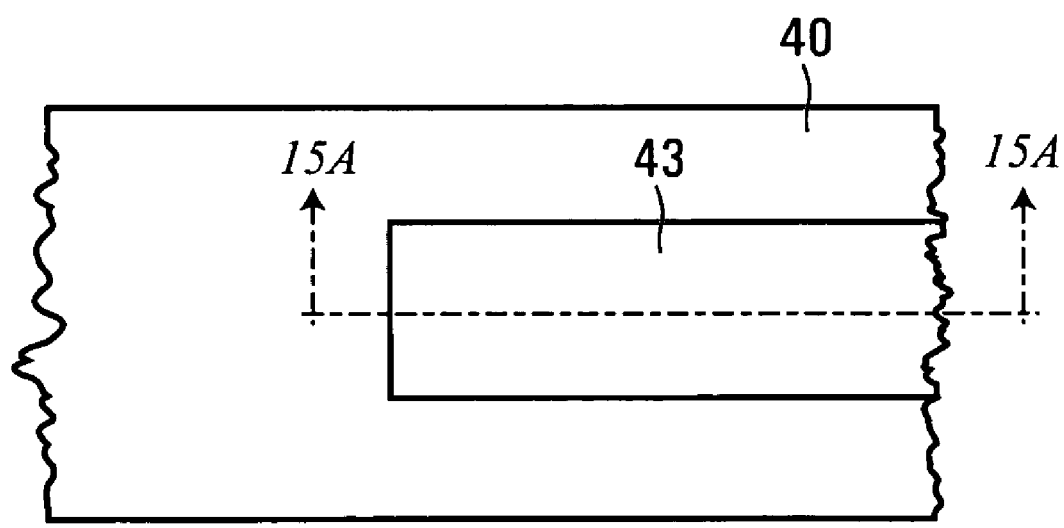
FIG. 15B illustrates a top plan view of the source portion of FIG. 15A.

The process to fabricate the n-channel (NMOS) VTFT 54 starts with the substrate 40 (see FIG. 15A), which is designed for use in the manufacture of active-matrix, flat-panel electronics. For example, glass and plastic are commonly used in such applications.

Mask 2.1

First, a non-refractory metal film, such as chromium (Cr) or aluminum (Al), is deposited onto the substrate 40 at room temperature, for example, by sputter deposition or evaporation techniques, for use as the source electrode 41. Thickness of this metal film is typically 100 nm, but this dimension is not critical.

Then, a heavily-doped, n-type semiconductor film, such as hydrogenated amorphous silicon ($n^+$ a-Si:H), microcrystalline silicon ($n^+$ μc-Si:H) or polysilicon ($n^+$ poly-Si), is deposited onto the source electrode 41 to act as the source ohmic contact layer 42. In the case of $n^+$ a-Si:H and $n^+$ μc-Si:H for an n-channel VTFT, the source ohmic contact layer 42 may, for example, be deposited by PECVD. As noted above, $n^+$ poly-Si can be made by ELA processing of the $n^+$ a-Si:H film. Other techniques are also capable of, and readily available for, $n^+$ a-Si:H, $n^+$ μc-Si:H and $n^+$ poly-Si film fabrication. The material used for the source ohmic contact layer 42 is preferably, though not necessarily, μc-Si:H due to the higher electrical conductivity of μc-Si:H in relation to a-Si:H and the simpler process conditions in relation to poly-Si. As discussed above, poly-Si has the highest electrical conductivity among the mentioned ohmic contact materials and can be used when manufacture complication is not a concern. It has been found that the thickness of the source ohmic contact layer 42 can be in the range from 100 to 300 nm without causing serious issues in the substrate topography.

After the depositing of the source ohmic contact layer 42, a heavily-doped, p-type semiconductor layer (5-20 nm), such as $p^+$ a-Si:H, is deposited, for example, by PECVD, to act as a source SCE suppression layer 43.

A photomask and a photoresist layer is used to expose the source electrode 41. In particular, wet etching or plasma etching, particularly RIE, can be used for etching the source SCE suppression layer 43 and the $n^+$ source ohmic contact layer 42. The wet etchant may, for instance, be a potassium hydroxide (KOH) solution, while the plasma etchant may, for instance, be a fluorine-based plasma (e.g., $CF_4$, $CF_4/H_2$, $CHF_3$), chlorine-based plasma (e.g., $CF_3Cl$, $CCl_4$, $BCl_3$) or a bromine-based plasma (e.g., HBr, $CF_3Br$) with appropriate vacuum process conditions. RIE is a more favorable etching technique, simply because of the anisotropic (directional) nature of RIE that provides for better linewidth control. However, it may be considered that precision on anisotropy is not important in this step (Mask 2.1). The Cr film underneath the patterned $n^+$ a-Si:H or $n^+$ μc-Si:H film may be etched by a Cr wet etchant, for example, $Cr(NH_4)_2(NO_3)_6+CH_3COOH+H_2O$, or a chlorine-based plasma. If the electrode material is Al instead of Cr, another wet etchant, for example, $H_3PO_4+CH_3COOH+HNO_3+H_2O$, or the chlorine-based (e.g., $Cl_2/BCl_3$) plasma etchant may be used for etching.

Figure 16A:
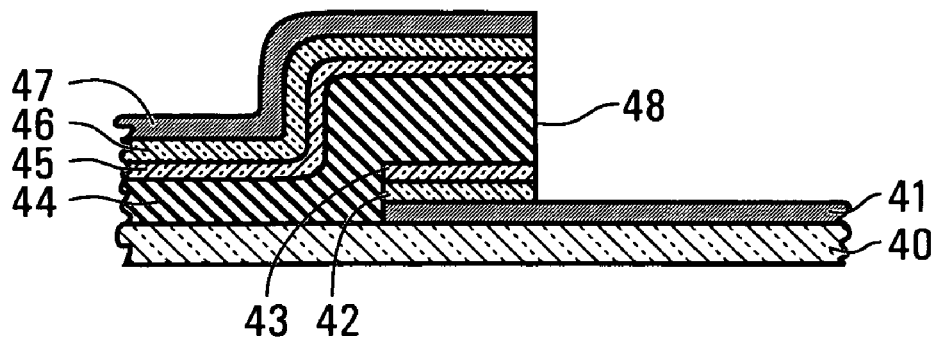
FIG. 16A illustrates a sectional view of a drain portion and the source portion in a stage of the fabrication the VTFT of FIG. 14.

Finally, the photoresist may be stripped away by a conventional stripper solution or an oxygen-based plasma (e.g., $O_2$, $O_2/CF_4$) to ready the structure for the next film deposition sequence. As illustrated in FIG. 16A, the etching of the source SCE suppression layer 43 and the $n^+$ source ohmic contact layer 42 leaves a relatively small region around which to build the remainder of the VTFT.

Mask 2.2

A dielectric film, such as hydrogenated amorphous silicon nitride (a-SiN$_x$:H), hydrogenated amorphous silicon oxide (a-SiO$_x$:H) or hydrogenated amorphous silicon oxynitride (a-SiO$_x$N$_y$:H), is then deposited (see FIG. 16A), for example, by PECVD, to act as a channel-length-defining dielectric 44 between the source electrode 22 and a yet-to-be-deposited drain electrode. Precise control of the thickness of the channel-length-defining dielectric film 44, for example, by deposition time, allows for an accurate definition of the channel length in submicron or sub-100 nm dimensions. Using current deposition techniques, the thickness of the channel-length-defining dielectric film 44 can be practically controlled from 25 to 1000 nm.

Another p-type semiconductor film (5-20 nm), such as $p^+$ a-Si:H, is then deposited to be a drain SCE suppression layer 45.

Next, another 100-300 nm $n^+$ a-Si:H, μc-Si:H, or poly-Si film is deposited to act as the drain ohmic contact layer 46.

Another 100-200 nm non-refractory metal (Cr or Al) film is subsequently deposited as the drain electrode 47.

Using photoresist as a mask, the metal/$n^+$/$p^+$/dielectric/$p^+$/$n^+$ multi-layered structure is etched to shape the drain. Initially, the metal film that forms the drain electrode 47 may be etched either by wet or plasma etchants. Subsequently, it is expected that the underlying layers 46, 45, 44, 43, 42 may be etched by RIE. The drain electrode 47 may serve as a self-aligned mask for the RIE process. Careful control of the anisotropy of the RIE process advantageously provides a surface 48 that is flat and vertical. As discussed above, a flat and vertical profile is preferred for a reliable VTFT completed by later film deposition processes.

Figure 16B:
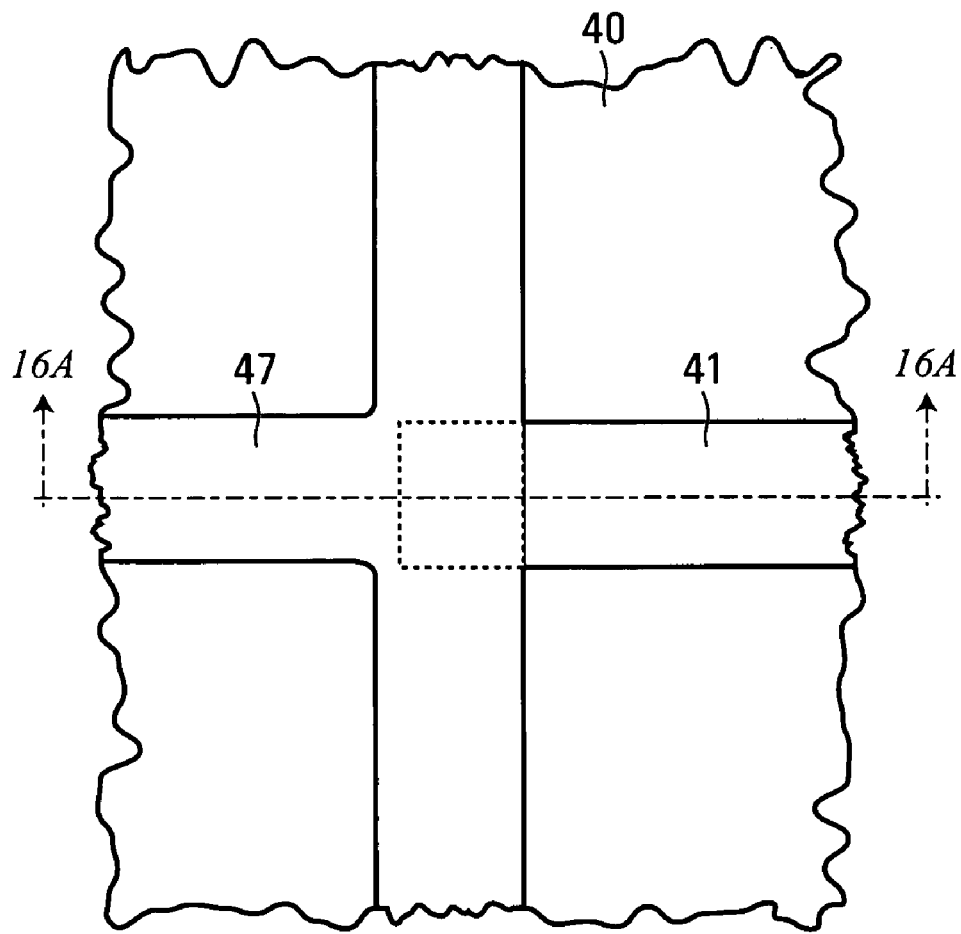
FIG. 16B illustrates a top plan view of the source and drain portions of FIG. 16A.

Note, from FIG. 16B, that the drain electrode 47 is formed in a "T" structure so that a fully non-overlapping vertical gate can be formed on this T structure in the later steps. In the subsequent masking steps, the channel width may be defined by the region where the T-shaped drain electrode 47 overlaps with the source electrode 41. The T structure may be considered to have a center portion from which two side portions extend.

Mask 2.3

Figure 17:
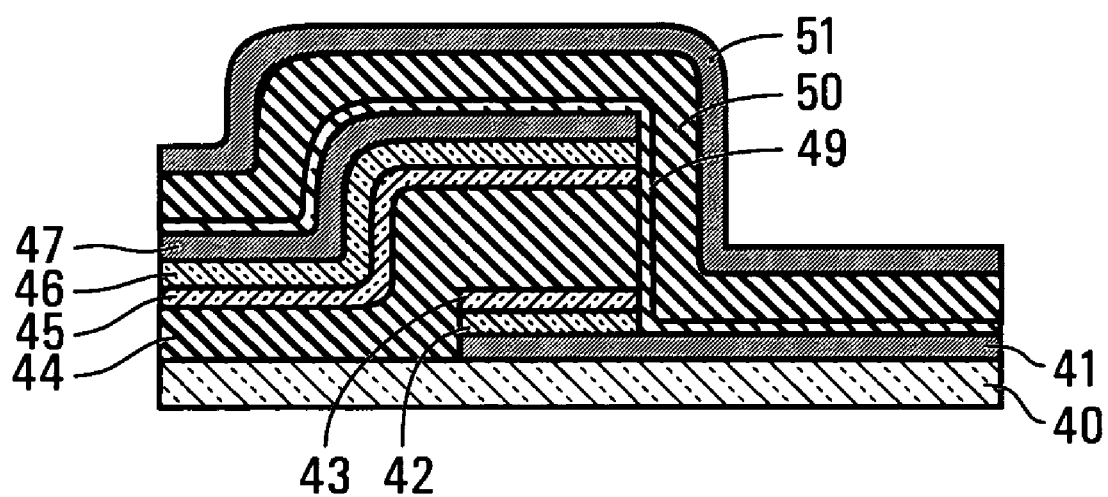
FIG. 17 illustrates a sectional view of a gate portion, the drain portion and the source portion in a stage of the fabrication the VTFT of FIG. 14.

An undoped semiconductor film, such as undoped a-Si:H, μc-Si:H or poly-Si, is then deposited (see FIG. 17) onto the vertical structure illustrated in FIG. 16A, for example, by PECVD, to serve as material for the active channel 49. The thickness of the active channel 49 should be of the order of 50 nm, or less, to reduce the leakage current due to SCLC during the off-state of the VTFT.

Then, an a-SiN$_x$:H, a-SiO$_x$:H, a-SiO$_x$NY:H or $Ta_2O_5$, gate dielectric film 50 and a 100-300 nm non-refractory metal (Cr or Al) gate electrode 51 are sequentially deposited to complete the formation of the vertical gate structure. The thickness of the gate dielectric film 50 should be scaled according to the channel length (i.e., the thickness of the channel-defining dielectric film 44) to provide sufficient gate control of the channel, but may be roughly in the range of 25 to 250 nm. The high-k dielectric, $Ta_2O_5$, may be used as the gate dielectric film 50 to obtain high drive current with thicker dielectric and to avoid high gate leakage current due to tunneling phenomena.

The non-refractory gate electrode 51 is then etched, for example, by chlorine-based plasma. Since chlorine-based plasma is highly selective against the usual gate dielectric material 50, e.g., a-SiN$_x$:H or a-SiO$_x$:H, the etch endpoint for the gate can be ensured.

A photoresist mask is then applied to pattern the gate electrode 51 on the channel side with wet etching or isotropic chlorine-based plasma etching.

Figure 18A:
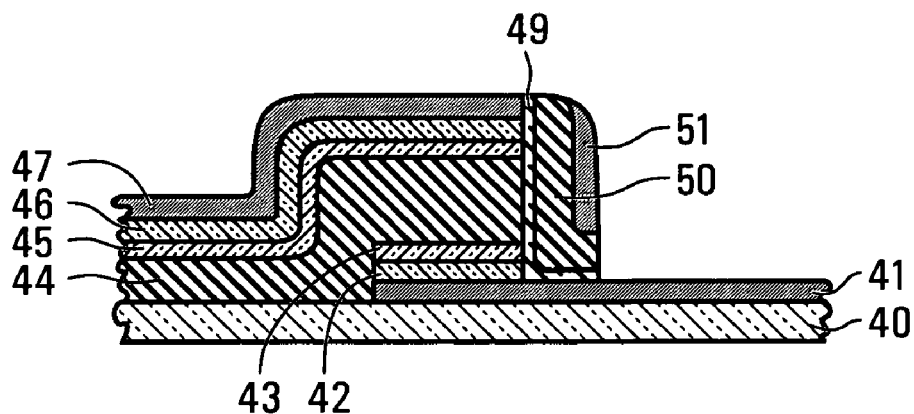
FIG. 18A illustrates a sectional view of gate, source and drain portions in a stage of the fabrication the VTFT of FIG. 14.
Figure 18B:
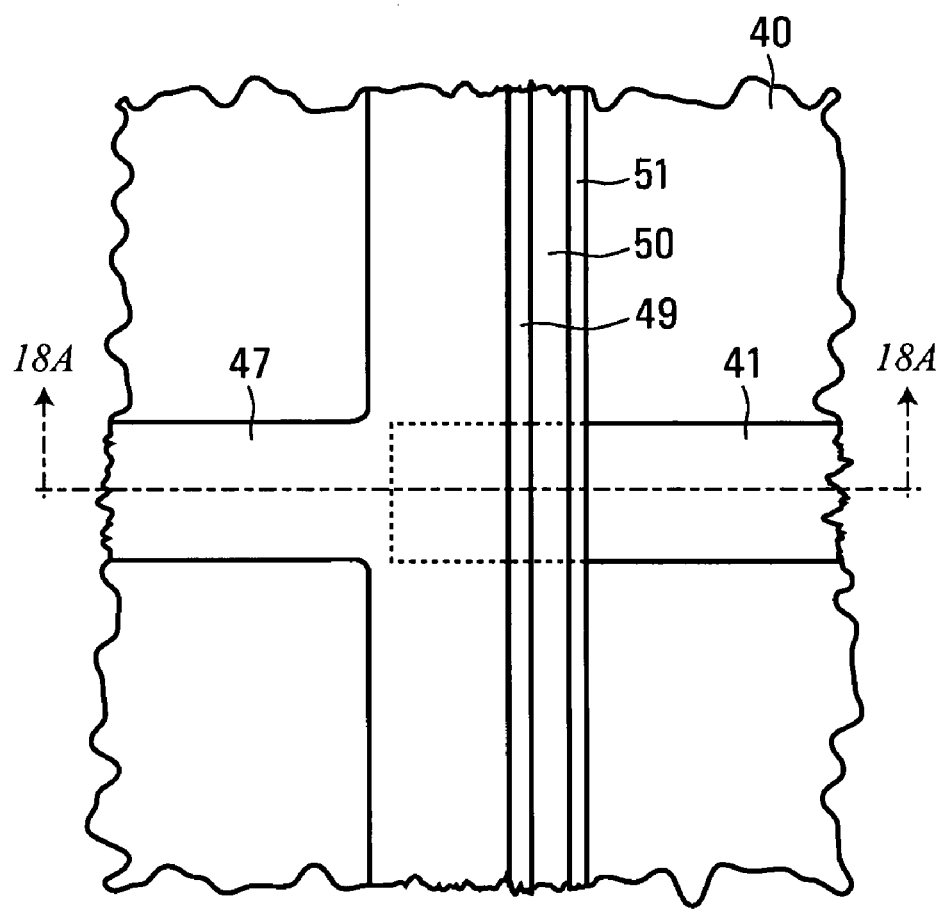
FIG. 18B illustrates a top plan view of the gate, source and drain portions of FIG. 18A.

After the photoresist is removed, another isotropic etching with wet or plasma chemistry is employed to remove the gate dielectric film 50 and the active channel 49 from the region over the drain electrode 47 and a portion of the region over the source electrode 41 to result in a structure as illustrated in FIG. 18A, a top, plan view of which is provided in FIG. 18B.

Mask 2.4

Figure 19A:
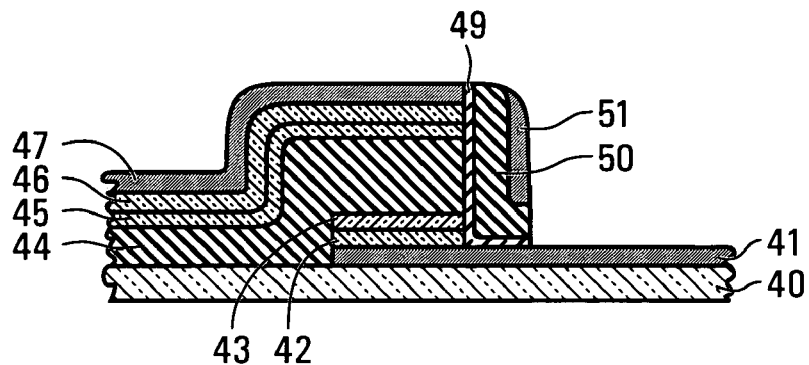
FIG. 19A illustrates a sectional view of gate, source and drain portions in a stage of the fabrication the VTFT of FIG. 14.

The next masking step enables the gate electrode 51 to be electrically isolated from the drain electrode 47. A photoresist is used to cover the source electrode 41 and the center portion of the drain electrode 47. Then, the drain ohmic contact layer 46, the drain SCE suppression layer 45 and the uncovered side portions of the drain electrode 47 are etched, for example, by wet or plasma etchants. After the side portion etching, the VTFT is complete (see FIG. 19B). Notably, the cross section as illustrated in FIG. 19A appears unchanged from the cross-section illustrated in FIG. 18A. However, in FIG. 19B, the channel-length-defining dielectric film 44 is exposed on the side portions of the T structure. The last two masks are for device passivation and final metallization or interconnections.

Note that, for a p-channel (PMOS) VTFT, the source ohmic contact layer 42 and the drain ohmic contact layer 46 are formed of a p-type semiconductor material and the counter-doped semiconductor layers 43, 45 are formed of an n-type semiconductor.

Mask 2.5

Figure 20A:
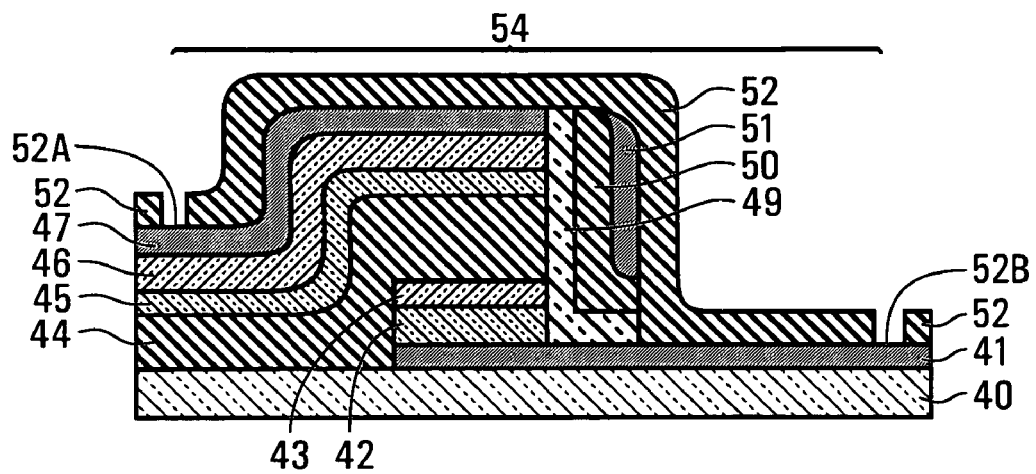
FIG. 20A illustrates a sectional view of the VTFT of FIG. 19A with the addition of a passivation layer.
Figure 20B:
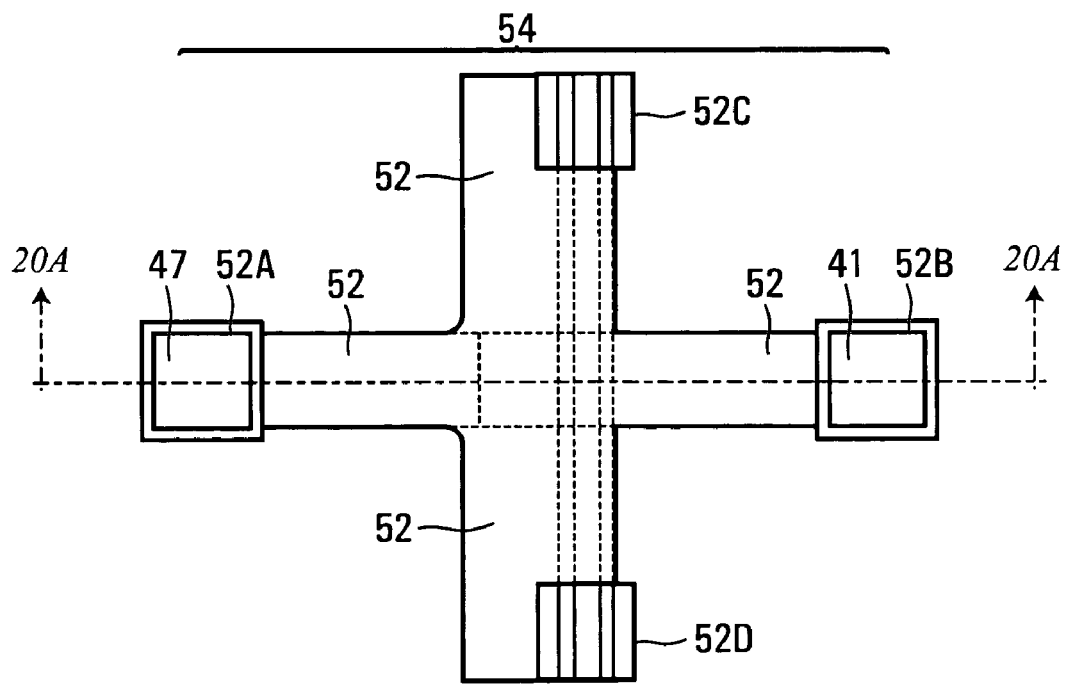
FIG. 20B illustrates a top plan view of the gate, source and drain portions of FIG. 20A.

A 100-300 nm a-SiN$_x$:H or a-SiO$_x$:H dielectric film is then deposited on the VTFT of FIG. 19A, for example, by PECVD, to serve as a passivation layer 52, as illustrated in section in FIG. 20A and in top, plan view in FIG. 20B, for electrical isolation and an etch-stop layer for final metallization or interconnections. In some cases, a low-k dielectric material, such as a BCB liquid-based photopolymer, is desirable to reduce capacitive coupling between metal lines as well as serving as a planarization layer to minimize substrate topography. The process technology for BCB is basically the same as, or very similar to, photoresist lithography.

At a certain distance away from the critical features of the modified new electrical conductivity structure, the passivation dielectric film 52 is then patterned with contact windows 52A, 52B, 52C and 52D (see FIG. 20B) to uncover the drain electrode 47, source electrode 41 and the gate electrode 51 (in two contact windows 52C, 52D) for making electrical connection with the final metal or interconnections. Wet or plasma etchants are well suitable for patterning the contact windows 52A, 52B, 52C and 52D.

Mask 2.6

Figure 21A:
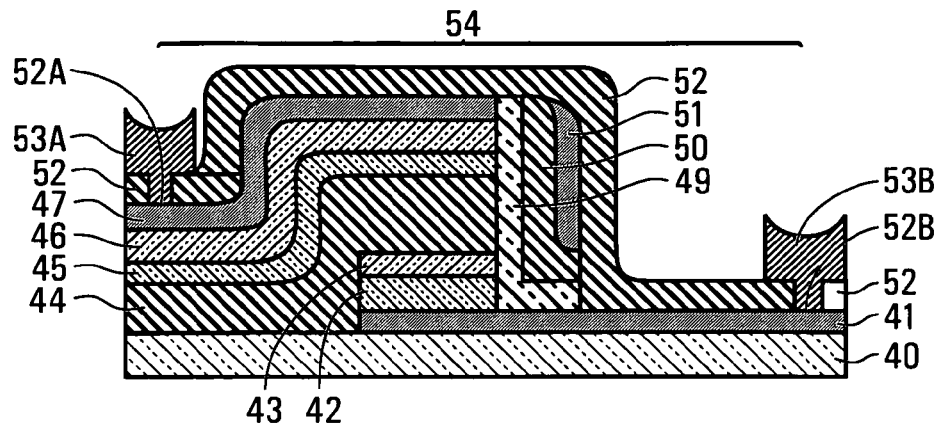
FIG. 21A illustrates a sectional view of the VTFT of FIG. 20A, where the contact windows have been filled in with interconnect material.
Figure 21B:
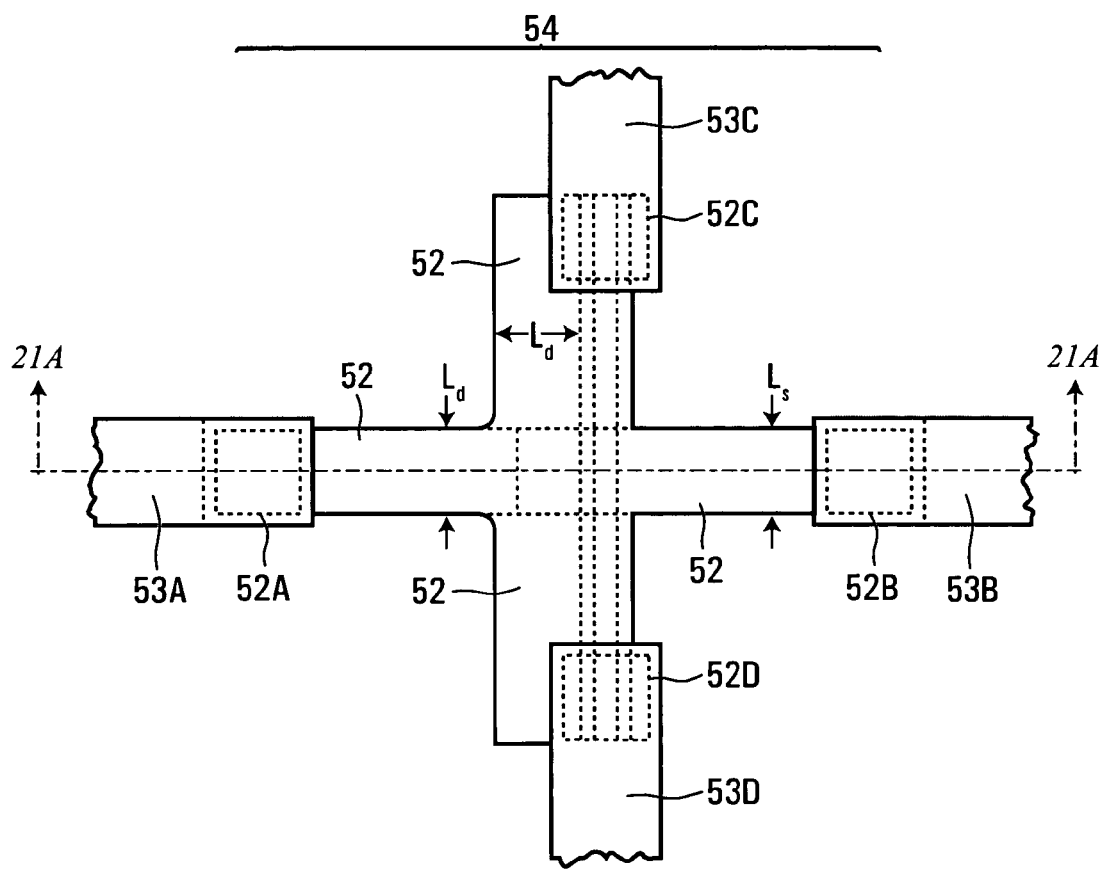
FIG. 21B illustrates a top plan view of the gate, source and drain portions of FIG. 21A.

A highly conductive metal film, such as aluminum (Al), is then deposited, as illustrated in section in FIG. 21A and in top, plan view in FIG. 21B, on the VTFT structure of FIGS. 20A and 20B, for example, by sputter deposition or evaporation, to function as the final metal or interconnections. The thickness of the metal film is preferably between 100 nm and 1 μm and is dependent on design considerations, such as electrical resistance and the manufacturing process requirements. Wet or plasma etchant can be used to pattern the metal film into a drain interconnect 53A, a source interconnect 53B and two gate interconnects 53C, 53D to complete the VTFT device fabrication.

Figure 19B:
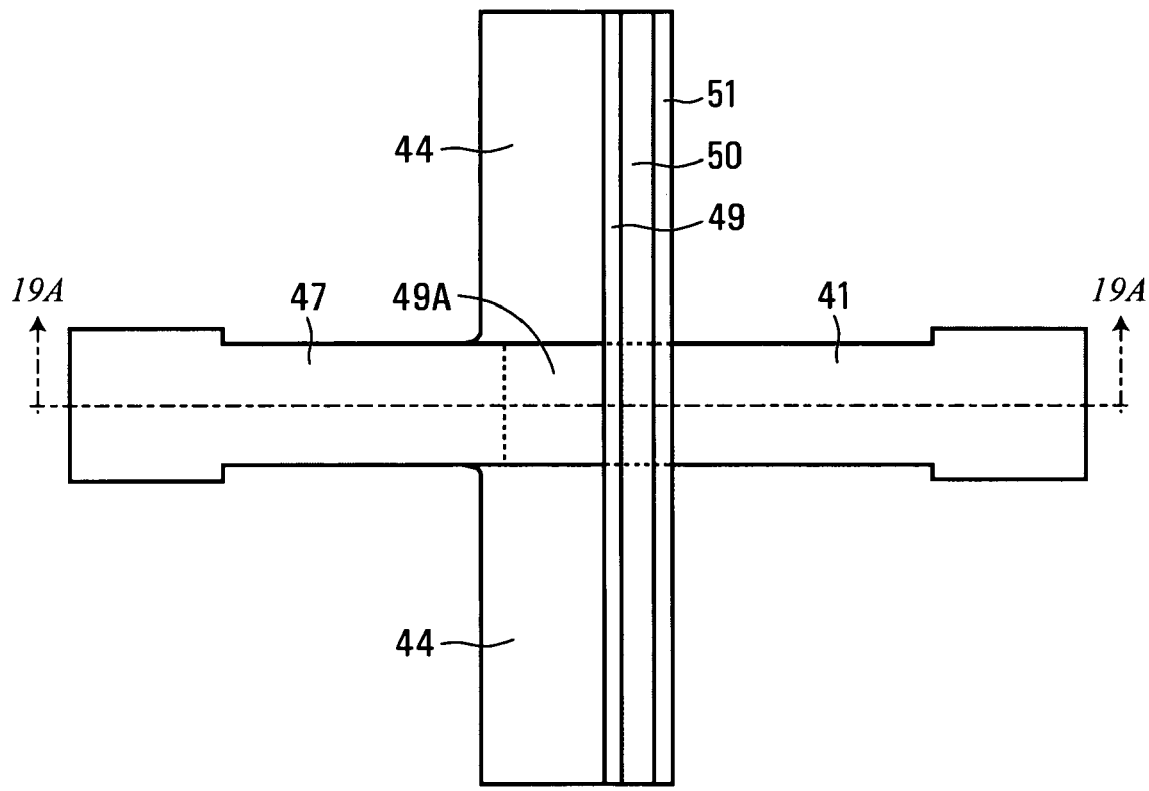
FIG. 19B illustrates a top plan view of the gate, source and drain portions of FIG. 19A.
Figure 22:
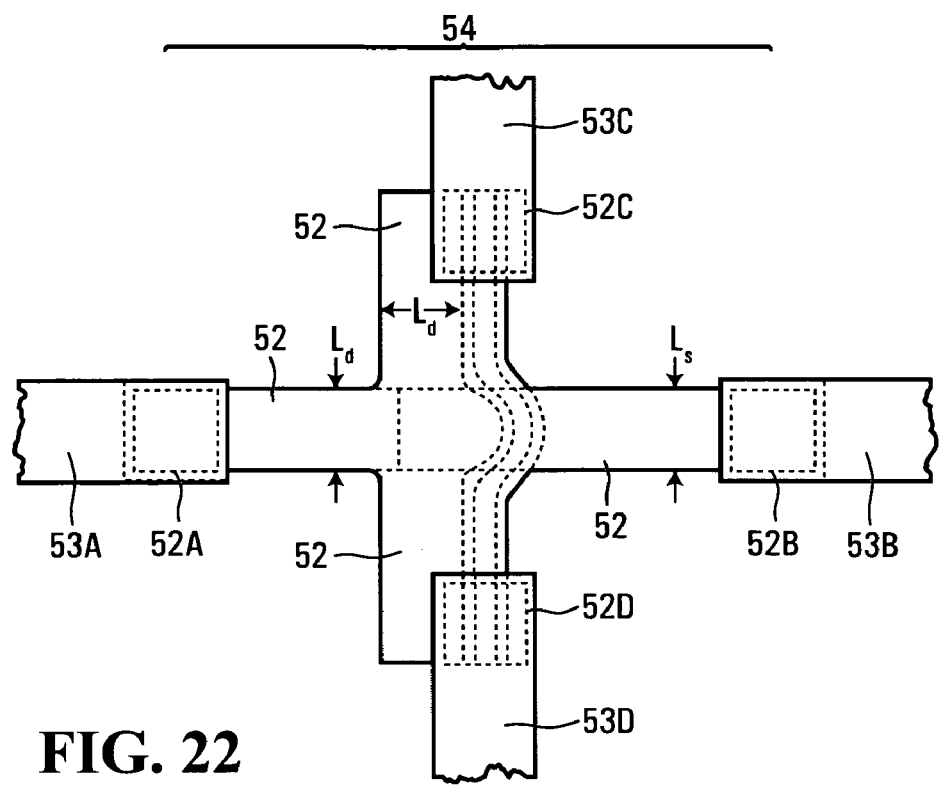
FIG. 22 illustrates a top plan view similar to FIG. 21B, wherein the channel geometry, rather than being straight, is semi-circular.
Figure 23:
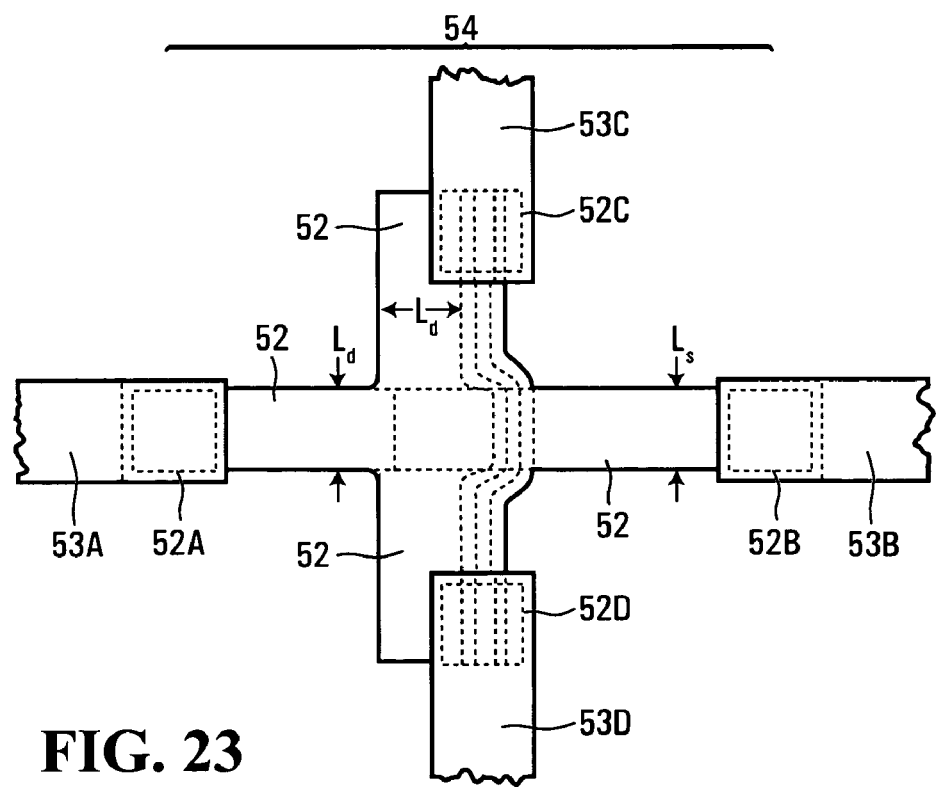
FIG. 23 illustrates a top plan view similar to FIG. 21B, wherein the channel geometry, rather than being straight, is round-cornered and rectangular.

Notably, FIGS. 18B, 19B, 20B and 21B include a reference numeral indicating a channel geometry 49A. In FIGS. 18B, 19B and 20B the channel geometry 49A, as seen in a top plan view, is straight. However, other shapes are considered, such as semi-circular (see FIG. 22) and round-cornered, rectangular (see FIG. 23). These channel geometries are designed to provide for channel width scalability without altering the size of the TFT.

Figure 24:
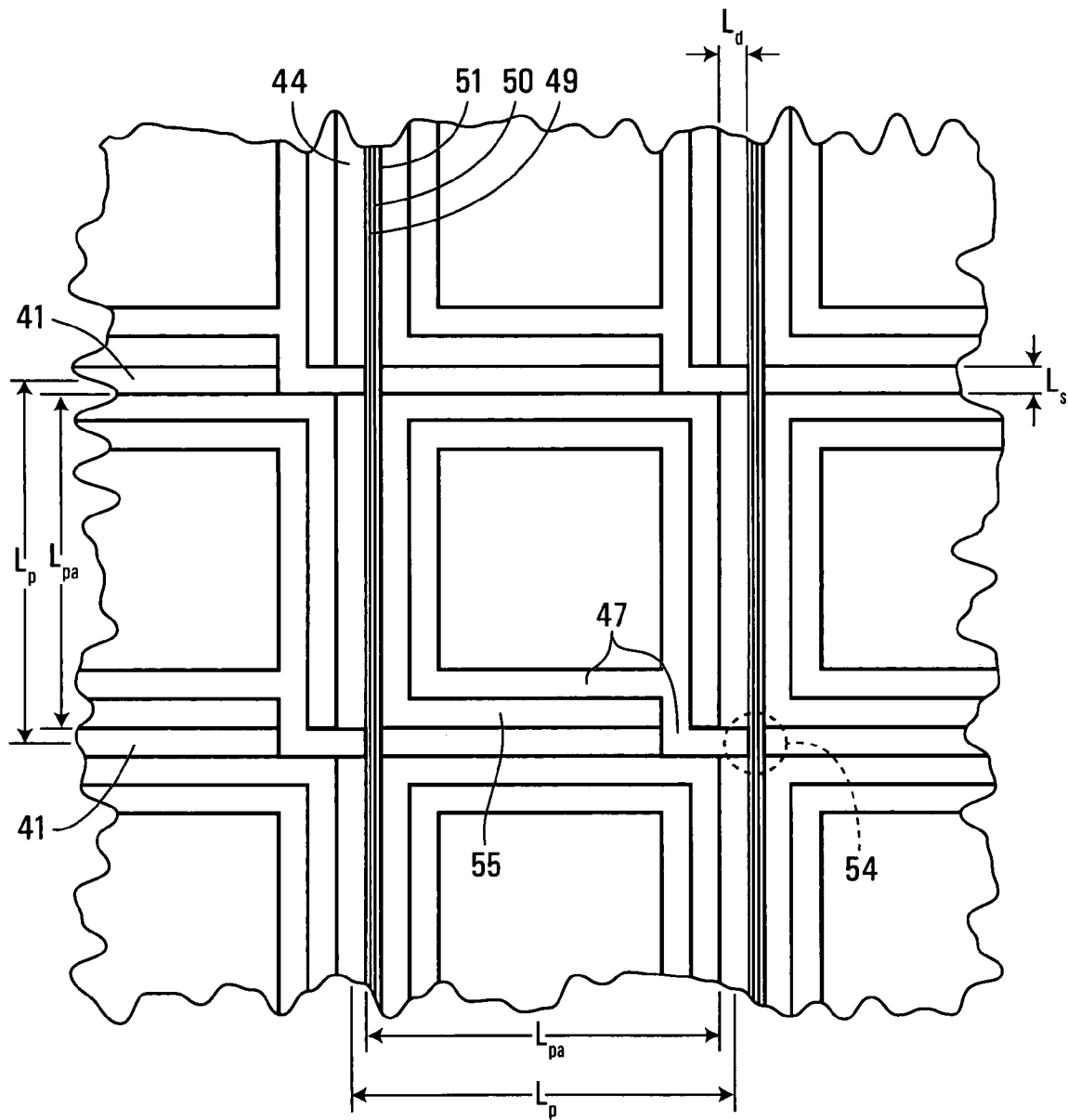
FIG. 24 illustrates a top plan view of an exemplary AMFPI backplane fabricated using the VTFT of FIG. 14.

In active-matrix backplane integration, the manufacturing process for an array of VTFT devices is slightly different than the process, discussed with reference to FIGS. 15A-20B, for fabricating a single VTFT device according to the VTFT 54. The process for an AMFPI backplane is completed after Mask 2.5, wherein the passivation layer 52 is deposited. A portion of an exemplary AMFPI backplane is illustrated in FIG. 24 before the passivation layer 52 is deposited. The AMFPI backplane of FIG. 24 includes areas 55 representative of areas for installation of photodiode sensors.

For an AMLCD backplane (FIG. 25), however, extra material is required, along with an extra photomask step between Mask 2.4 and Mask 2.5, to form a transparent pixel electrode 56. The material for the transparent pixel electrode 56 may be, for example, ITO, and may be deposited, onto the drain electrode 47 in the VTFT of FIG. 19A, to a thickness of around 100 nm. The ITO may then be etched to pattern a structure for the transparent pixel electrode 56. Next, a passivation layer may be deposited and a contact window may be patterned in the passivation layer to complete the process. The AMLCD backplane of FIG. 25 includes areas 58 representative of areas for installation of liquid crystal. Therefore, in total, six photomask steps are needed for a generalized AMLCD backplane.

An ITO layer is typically etched by an HCl solution. However, in this exemplary process sequence, it may be shown that HCl cannot provide the necessary etch selectivity between ITO and the underlying metal layers. Therefore, it is preferred to etch the ITO layer with a plasma etchant, such as CH$_4$/H$_2$, which can provide much better process control and material selectivity.

Alternatively, the ITO layer may be used for both the drain electrode 47 and the pixel electrode 56, in which case the ITO layer may be deposited by radio frequency magnetron sputtering and patterned by a plasma etchant. Accompanying such an approach, rather than the 100-300 nm n+ a-Si:H, μc-Si:H, or poly-Si film, a thinner (30-50 nm), high transparency, doped semiconductor may be deposited, in the Mask 2.2 process, to act as the drain ohmic contact layer 46. Advantageously, using the ITO layer for both the drain electrode 47 and the pixel electrode 56 eliminates the requirement for an extra mask to pattern the pixel electrode 56 and provides pixel aperture transmittance.

Other process modifications, not described here, can equally be implemented to give the same VTFT active-matrix design structure with similar or lower manufacturing cost and process complexity while meeting the design concept of a fill factor that is independent of TFT size.

FIG. 12 illustrates a configuration of an active-matrix for an AMFPI using VTFTs having the VTFT 35 as pixel switches. Since the smallest VTFT can be fabricated within the intersectional area of the electrodes, a plurality of VTFT pixel switches can be completely hidden at the intersections of the grid lines (the gate electrode lines 32 and the source electrode lines 22) of the active-matrix. Therefore, the VTFT pixel switches do not obstruct pixel area for the photodiode sensors. The areas 36 for the photodiode sensors extend to the boundaries defined by the grid lines to maximize the pixel fill factor for a pixelated imaging array. In other words, the fill factor becomes truly independent of the size of the TFT.

The AMFPI application and the AMLCD application differ in that the pixel electrode 28, which is an extension of the drain electrode 28 for the AMFPI application (FIG. 12), can be any suitable opaque metal such as Mo, Cr or Al, while the pixel electrode 37 for the AMLCD application (FIG. 13) is preferably a transparent conductor, such as ITO. Furthermore, the areas 39 for the AMLCD application (FIG. 13) are occupied by liquid crystals in contrast to the areas 36 for the AMFPI application (FIG. 12), which are occupied by photodiode sensors.

For the AMFPI application, aspects of the present invention allow a photodiode sensor installed in one of the areas 36 to be a continuous structure, instead of being patterned into a discretized array of photodiode sensors in order to achieve 100% fill factor.

Scale-down of the area of the VTFT 54 by higher lithographic resolution can be achieved with minimal change in channel width by using different channel geometries to compensate for the reduction of the linewidth of the drain electrode 47. Thus, device performance can be maintained for a smaller transistor footprint. For example, if the linewidth of the drain electrode 47 and the source electrode 41 is reduced from 5 µm to 3.7 µm and the channel geometry changes from semi-circular to round-cornered, rectangular, the change in channel width and transistor area may be as follows. With 5-µm linewidth, $W_c=\frac{1}{2}(2\times\pi\times2.5)=7.85$ µm and $A=5\times5=25$ µm²; with 3.7 linewidth, $W_{rcr}=\frac{1}{2}(2\times\pi\times1)+1.7+2(1.5)=7.84$ µm (0.1% reduction) and $A=5\times3.7=18.5$ µm² (26% reduction), where it is assumed that the round corners have a 1-µm radius and the protruded length of the "tip" of the drain electrode 47 is the same for both round-cornered, rectangular and semi-circular channel geometries. If the channel geometry is rather unchanged, the semi-circular channel width will become this: $W_c=\frac{1}{2}(\pi\times3.7)+2(0.65)=7.11$ µm (9.5% reduction), where it is assumed that the protruded length of the "tip" of the drain electrode 47 is the same for both 5-µm and 3.7-µm linewidths.

The top views (FIGS. 21B, 22, 23) of the VTFT 54 show how the vertical gate electrode 51 can be accessible by metal interconnections 53C and 53D. The vertical gate electrode 51 is extended away from the critical area of the VTFT, thus metal interconnections 53C and 53D can be formed without imposing practical issues on the integrity of the VTFT 54. The top views also show that channel width scaling by channel geometry, as illustrated in FIGS. 9B and 9C for the VTFT 35, is also applicable to the VTFT 54.

FIG. 24 illustrates the configuration of the active-matrix for AMFPI using VTFTs having the VTFT 54 as pixel switches. The fill factor here is independent of TFT size, as is the case for the use of VTFTs having the VTFT 35 as pixel switches, discussed above with reference to FIG. 12.

Figure 25:
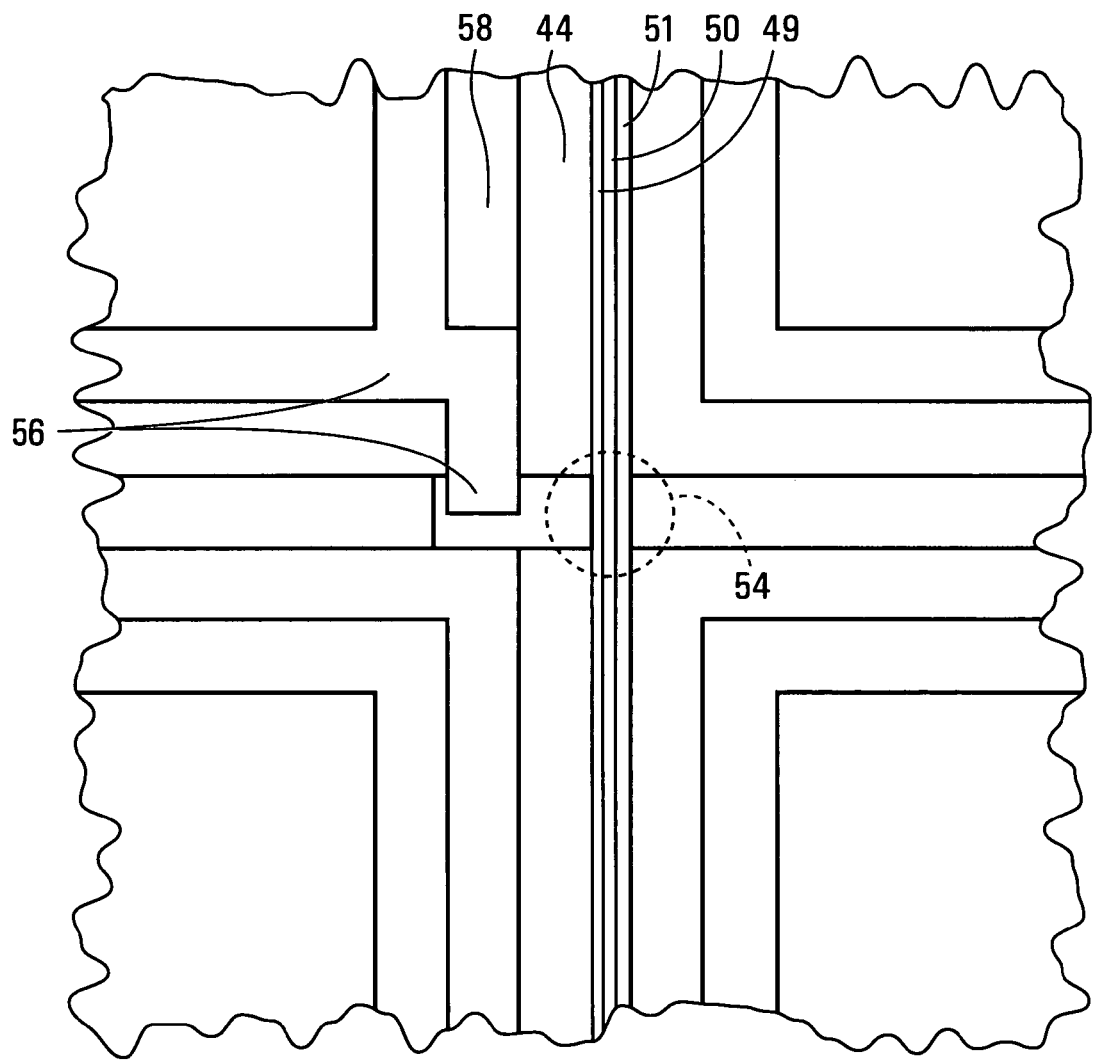
FIG. 25 illustrates a top plan view of an exemplary AMLCD backplane fabricated using the VTFT of FIG. 14.

FIG. 25 illustrates the configuration of the active-matrix for AMLCD using VTFTs having the VTFT 54 as pixel switches. The fill factor here is also independent of TFT size, as is the case for the use of the VTFTs 35 as pixel switches, discussed above with reference to FIG. 13.

Figure 13:
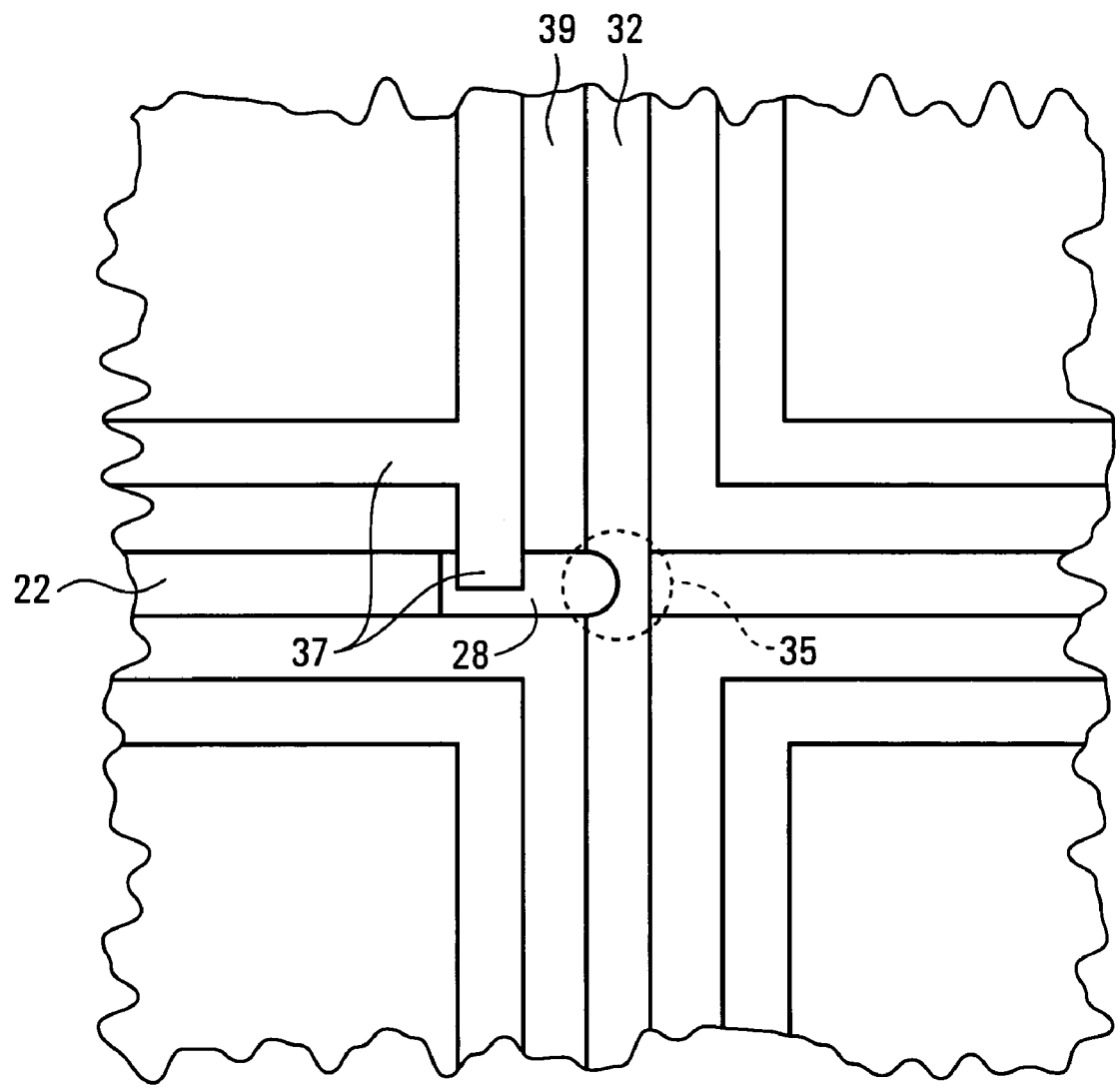
FIG. 13 illustrates a top plan view of an exemplary AMLCD backplane fabricated using the VTFT of FIG. 5.

FIG. 25 differs from FIG. 24 in the same manner as FIG. 13 differs from FIG. 12 in that the pixel electrode and the drain electrode 47 for the AMFPI application (FIG. 24) may be any suitable opaque metal such as Mo, Cr or Al while the pixel electrode 56 is preferably a transparent conductor, such as ITO, for the AMLCD active-matrix of FIG. 25. Similarly, while the areas 55 of the AMFPI active-matrix are suited to photodiode sensors, the areas 58 of the AMLCD active-matrix are suited to liquid crystals.

Though not shown in FIG. 12, a storage capacitor may be associated with the drain electrode 28 of each VTFT structure in the exemplary AMFPI backplane portion illustrated in FIG. 12.

During operation of the exemplary AMFPI backplane portion illustrated in FIG. 12, the VTFT 35 is maintained in a non-conducting state through application of a negative bias voltage to the gate electrode 32. During an imaging stage, while the VTFT 35 is in the non-conducting state, an imaging signal created by radiation incident on an associated photodiode sensor may result in a voltage level being stored in the storage capacitor. During a readout stage, the voltage level stored in the storage capacitor can be sampled by turning the VTFT 35 to a conducting state. This sampling may be accomplished through application of a positive bias voltage to the gate electrode 32. The result of such a bias application may be a conducting channel being formed in the dielectric film 25 between the source electrode 22 and the drain electrode 28 and, consequently, a current flow in the source electrode 22. The current from the source electrode 22 is related to the magnitude of the voltage stored in the storage capacitor.

Though not shown in FIG. 13, a storage capacitor may be also be associated with the pixel electrode 37 of each VTFT 35 in the exemplary AMLCD backplane portion illustrated in FIG. 13. Additionally, as a consequence of the fabrication of color-filter substrate over the pixel electrode 37 and the addition of liquid crystal material sealed between the color-filter substrate and the pixel electrode 37, a liquid crystal capacitance may be established. This liquid crystal capacitance may be logically referred to as a liquid crystal capacitor.

During operation of the exemplary AMLCD backplane portion illustrated in FIG. 13, application of a pulse, with a peak at a positive bias level, to the gate electrode 32 places the VTFT 35 temporarily in a conducting state. While the VTFT 35 is in the conducting state, a conducting channel is established in the dielectric film 25 between the source electrode 22 and the drain electrode 28 and, consequently, the storage capacitor and the liquid crystal capacitor become charged and the voltage level on the pixel electrode 37, which is in conductive connection with the drain electrode 28, rises to the voltage level applied to the source electrode 22. The voltage on the pixel electrode 37 is then subjected to a level shift resulting from a parasitic capacitance between the gate electrode 32 and the pixel electrode 37 when the voltage on the gate electrode 32 returns to a negative bias level, thereby turning the VTFT 35 from the conducting state to the non-conducting state. After the level shift, the charged state can be maintained as the voltage on the gate electrode 32 returns to the negative bias level, at which time the VTFT 35 enters the non-conducting state. The main function of the storage electrode is to maintain the voltage on the pixel electrode 37 until the next signal voltage is applied.

While a charged state is maintained in the storage capacitor and the liquid crystal capacitor and, consequently, on the pixel electrode 37, the optical transmittance of the liquid crystal will reflect the voltage level of the charge on the pixel electrode 37. As such, the amount of light, which generated behind the exemplary AMLCD backplane portion illustrated in FIG. 13, that is transmitted through the pixel area 39 associated with the VTFT 35 will be related to the voltage level that was applied to the source electrode 22 when the VTFT 35 was in the conducting state.

By integrating VTFTs with photodiode sensors, as described above, an immediate benefit to digital X-ray mammography may be realized. It has been suggested (see, for example, W. Zhao and J. A. Rowlands, X-ray imaging using amorphous selenium: feasibility of a flat panel self-scanned detector for digital radiology, Med. Phys. 22 (10), October 1995, pp. 1595-1604) that a pixel pitch ($L_p$) of the order of 50 µm may be required to produce images having resolution suitable for medical uses. Advantageously, through the use of the VTFTs described herein, a 50 µm pixel pitch is considered achievable.

Since, the features of the VTFTs 35, 54 are hidden at the intersections of the gate lines and the data lines, the size of the features does not obstruct any substrate area for photodiode sensor fabrication within the pixels. The resolution, or pixel fill factor, is, therefore, completely independent of the TFT size, regardless of whether the photo-sensor architecture is pixelated or continuous. Based on 5-µm lithographic technology, the estimated fill factor for a 50-µm pitch pixelated array built with one of the VTFTs is 81%, as opposed to an estimated fill factor of 37% for lateral TFTs. It is contemplated that this new design should be compatible with active-matrix display applications.

Such a compact TFT may be extended to the design of on-pixel circuitry to develop "smart" pixels without significant trade-offs in the image resolution. Examples of "smart" pixel concept include an active pixel sensor architecture for active-matrix imagers, proposed in K. S. Karim et al., Amorphous silicon active pixel sensor readout circuit for digital imaging, IEEE Trans. Elec. Dev., Vol. 50 (1), January 2003, pp. 200-208, and several current- or voltage-programmed pixel circuits for active-matrix organic light emitting diode (AMOLED) displays, proposed in A. Nathan et al., Driving schemes for a-Si and LTPS AMOLED displays, J. Disp. Technol., Vol. 1 (2), December 2005, pp. 267-277. VTFT-based electronics are well-suited to electronic imaging applications and to display applications that demand 50-μm pitch resolution and beyond at the present state of art or in the future.

Advantageously, the VTFTs proposed herein have an electrode arrangement that minimizes the lateral TFT size on the substrate for any given lithographic technology. As lithographic resolution improves, the VTFT will continue to be realized in the smallest size by each new technology standard. For example, if the lithographic technology used is 5 pm, the smallest VTFT size is 5×5 μm². If the technology is advanced to 1 μm, the VTFT size would be 1×1 μm². This trend will follow until the VTFT size is so small that the performance is prevailed by quantum mechanical effects.

Furthermore, the VTFT allows the scale-up of the channel width by controlling perimeter dimensions of the drain electrode through changing the perimeter geometry, but without changing the size of the TFT.

The minimum TFT area can be maintained with different channel geometries for the channel width and different channel-defining dielectric thickness for the channel length, i.e., W/L ratio. For example, with a channel length of 100 nm and channel width of 9.14 μm, a W/L ratio of 91.4 results, meanwhile the TFT area can be maintained at 5×5 μm².

Additionally, the VTFT can suppress the short-channel effects in VTFT electrical characteristics. The VTFT can be incorporated into active-matrix electronics as pixel switches.

The VTFT, when used in flat-panel electronics, does not just have a smaller size than the a lateral TFT structure, which improves the fill factor (or aperture ratio), but, in a special arrangement, the entire VTFT structure is hidden within the intersectional area of a gate line and a data line, thereby maximizing the fill factor (or aperture ratio). In other words, the fill factor (or aperture ratio) may be considered to be truly independent of the size of the TFT.

The VTFT may be considered to be compatible with an existing continuous photosensor approach to achieve 100% fill factor.

Beneficially, the TFT size of the VTFT is small enough that the VTFT can be used to build circuitry within the pixel area without significant tradeoff with the fill factor (or aperture ratio).

Photo-induced current can be eliminated by virtue of the VTFT, whereby the electrodes completely shield the active channel from lights in imaging or display applications.

In the VTFT 54, illustrated in FIG. 14, the gate electrode 51 is completely vertical and located along the surface 48 of the combined source structure, dielectric and drain structure. By locating the gate electrode 51 in this manner, the gate-to-source lateral overlap capacitance may be minimized and the gate-to-drain lateral overlap capacitance may be eliminated. Such capacitances are normally present due to constraints in photolithography. Additionally, the VTFT 54 may be considered accessible by metal line interconnection.

As has been discussed above, the VTFT enables the fabrication of p-channel (PMOS) a-Si:H TFTs. It is known that PMOS TFTs are not practically useful when implemented as lateral TFTs or as submicron-channel VTFTs without short-channel effect suppression. Therefore, aspects of the present invention may lead to a new nanoscale CMOS (NMOS+PMOS) technology, which may be built upon the mature a-Si:H infrastructure. Such a new nanoscale CMOS technology would have advantages over crystalline silicon technology, specifically for display and imaging electronics. The advantages are expected to include a reduction in constraints on substrate type, size, orientation and mechanical flexibility. Furthermore, such a new nanoscale CMOS technology is expected to reduce costs associated with electronic fabrications and provide many technical benefits.

The VTFT technology, represented by aspects of the present invention, enables the construction, in one fabrication process, of complex integrated circuits that include an active-matrix backplane and peripheral drivers on the same panel. Traditionally, peripheral drivers for TFT backplanes have been implemented as crystalline silicon CMOS devices, which were then connected to the TFT backplane by way of interfacing bond wires.

The VTFT technology enables creation of a plurality of CMOS transistors with high device packing density and large-area uniform electronic properties, where each of the CMOS transistors has an extremely short channel defined by dielectric film thickness. The plurality of CMOS transistors may then be employed to perform high-speed logic operations over meterscale-area substrate.

By leveraging the mature a-Si:H infrastructure to implement CMOS TFTs in the VTFT technology, the capital investment on nanolithography required to implement CMOS TFTs in crystalline silicon CMOS technology is eliminated. As such, the present invention is expected to lead to significant and measurable economic, social and exploitation impact to the display and imaging industries. The quantity of household, office and medical appliances that may employ aspects of the present invention on rigid and flexible substrates is virtually countless. Such appliances may include medical radiograph equipment, pagers, cell phones, laptops, televisions, e-books, artificial retina implants, environmental monitors, etc. Aspects of the present invention may therefore be used to create new industries or make existing industries more competitive through the incorporation of this unprecedented technology.

Other modifications will be apparent to those skilled in the art and, therefore, the invention is defined in the claims.

We claim:

1. A vertical thin film transistor comprising:
a source semiconductor layer doped in a first manner and in communication with a source electrode;
a drain semiconductor layer vertically spaced from said source semiconductor layer, doped in said first manner and in communication with a drain electrode;
a first intermediate semiconductor layer doped in a second manner counter to said first manner and formed adjacent to said source semiconductor layer, between said source semiconductor layer and said drain semiconductor layer;
a second intermediate semiconductor layer doped in said second manner and formed adjacent to said drain semiconductor layer, between said source semiconductor layer and said drain semiconductor layer;

a dielectric layer formed between said first intermediate semiconductor layer and said second intermediate semiconductor layer;

where said source semiconductor layer, said first intermediate semiconductor layer, said dielectric layer, said second intermediate semiconductor layer and said drain semiconductor layer are arranged to define a surface extending from said source semiconductor layer to said drain semiconductor layer;

a channel semiconductor layer formed on said surface, wherein a conducting channel may be established between said source semiconductor layer and said drain semiconductor layer; and a gate electrode proximate said channel semiconductor layer such that a voltage applied to said gate electrode controls a conductivity of said conducting channel.

2. The vertical thin film transistor of claim 1 wherein said first manner is n-type doping.

3. The vertical thin film transistor of claim 2 wherein said source semiconductor layer is formed of a material selected from the group consisting of n-type amorphous silicon, n-type microcrystalline silicon and n-type polysilicon.

4. The vertical thin film transistor of claim 2 wherein said drain semiconductor layer is formed of a material selected from a group consisting of n-type amorphous silicon, n-type microcrystalline silicon and n-type polysilicon.

5. The vertical thin film transistor of claim 2 wherein said second manner is p-type doping.

6. The vertical thin film transistor of claim 5 wherein said first intermediate semiconductor layer is formed of p-type amorphous silicon.

7. The vertical thin film transistor of claim 5 wherein said second intermediate semiconductor layer is formed of p-type amorphous silicon.

8. The vertical thin film transistor of claim 5 wherein electrons are majority charge carriers when said channel semiconductor layer has been controlled to conduct.

9. The vertical thin film transistor of claim 1 wherein said first manner is p-type doping.

10. The vertical thin film transistor of claim 9 wherein said source semiconductor layer is formed of a material selected from the group consisting of p-type amorphous silicon, p-type microcrystalline silicon and p-type polysilicon.

11. The vertical thin film transistor of claim 9 wherein said drain semiconductor layer is formed of a material selected from a group consisting of p-type amorphous silicon, p-type microcrystalline silicon and p-type polysilicon.

12. The vertical thin film transistor of claim 9 wherein said second manner is n-type doping.

13. The vertical thin film transistor of claim 12 wherein said first intermediate semiconductor layer is formed of n-type amorphous silicon.

14. The vertical thin film transistor of claim 12 wherein said second intermediate semiconductor layer is formed of n-type amorphous silicon.

15. The vertical thin film transistor of claim 11 wherein holes are majority charge carriers when said channel semiconductor layer has been controlled to conduct.

16. The vertical thin film transistor of claim 1 wherein said channel semiconductor layer is formed of a material selected from the group consisting of hydrogenated amorphous silicon, hydrogenated microcrystalline silicon and polysilicon.

17. The vertical thin film transistor of claim 1 further comprising a gate insulator layer formed between said gate electrode and said channel semiconductor layer.

18. The vertical thin film transistor of claim 17 wherein said gate insulator layer is formed of a material selected from the group consisting of hydrogenated amorphous silicon nitride, hydrogenated amorphous silicon oxide, hydrogenated amorphous silicon oxynitride and tantalum oxide.

19. The vertical thin film transistor of claim 1 wherein said dielectric layer is formed of a material selected from the group consisting of silicon nitride, silicon oxide, silicon oxynitride and tantalum oxide.

20. An integrated circuit comprising:

a complementary pair of vertical thin film transistors including:

a first vertical thin film transistor comprising:

a source n-type semiconductor layer in communication with a first transistor source electrode;

a drain n-type semiconductor layer vertically spaced from said source n-type semiconductor layer, and in communication with a first transistor drain electrode;

a first intermediate p-type semiconductor layer formed adjacent to said source semiconductor layer, between said source n-type semiconductor layer and said drain n-type semiconductor layer;

a second intermediate p-type semiconductor layer formed adjacent to said drain n-type semiconductor layer, between said source n-type semiconductor layer and said drain n-type semiconductor layer;

a first dielectric layer formed between said first intermediate p-type semiconductor layer and said second intermediate n-type semiconductor layer;

where said source n-type semiconductor layer, said first intermediate p-type semiconductor layer, said first dielectric layer, said second intermediate n-type semiconductor layer and said drain n-type semiconductor layer are arranged to define a first transistor surface extending from said source n-type semiconductor layer to said drain n-type semiconductor layer;

a first transistor channel semiconductor layer formed on said first transistor surface, wherein a first transistor conducting channel may be established between said source n-type semiconductor layer and said drain n-type semiconductor layer; and a first transistor gate electrode proximate said first transistor channel semiconductor layer such tat a voltage applied to said n-type gate electrode controls a conductivity of said first transistor conducting channel; and a second vertical thin film transistor comprising:

a source p-type semiconductor layer in communication with a second transistor source electrode;

a drain p-type semiconductor layer vertically spaced from said source p-type semiconductor layer, and in communication with a second transistor drain electrode;

a first intermediate n-type semiconductor layer formed adjacent to said source p-type semiconductor layer, between said source p-type semiconductor layer and said drain p-type semiconductor layer;

a second intermediate n-type semiconductor layer formed adjacent to said drain p-type semiconductor layer, between said source p-type semiconductor layer and said drain p-type semiconductor layer;

a second dielectric layer formed between said first intermediate n-type semiconductor layer and said second intermediate n-type semiconductor layer;

where said source p-type semiconductor layer, said first intermediate n-type semiconductor layer, said second dielectric layer, said second intermediate n-type semiconductor layer and said drain p-type semiconductor layer are arranged to define a second transistor surface extending from said source p-type semiconductor layer to said drain p-type semiconductor layer;

a second transistor channel semiconductor layer farmed on said second transistor surface, wherein a second transistor conducting channel may be established between said source p-type semiconductor layer and said drain p-type semiconductor layer; and a second transistor gate electrode proximate said second transistor channel semiconductor layer such that a voltage applied to said p-type gate electrode controls a conductivity of said conducting channel wherein said second transistor drain electrode is in communication with said first transistor drain electrode.

21. A vertical thin film transistor comprising:

a source structure including:
    a source electrode layer;
    a source ohmic contact semiconductor layer in communication with said source electrode layer, doped in a first manner; and
    a source intermediate semiconductor layer deposited on said source ohmic contact semiconductor layer and doped in a second manner, where said second manner is counter said first manner;

a dram structure including:
    a drain intermediate semiconductor layer doped in said second manner;
    a drain ohmic contact semiconductor layer deposited on said drain intermediate semiconductor layer and doped in said first manner; and
    a drain electrode layer in communication with said drain ohmic contact layer;
    a dielectric layer deposited between said source structure and said drain structure;
    where said source ohmic contact semiconductor layer, said source intermediate semiconductor layer, said dielectric layer, said drain intermediate semiconductor layer and said drain ohmic contact semiconductor layer are arranged to define a surface extending from said source electrode layer to said drain electrode layer; and a gate structure including:
    an active semiconductor layer deposited over said drain electrode layer, along said surface and over said source electrode layer;
    a gate insulator layer deposited adjacent said active semiconductor layer; and
    a gate electrode layer deposited adjacent said gate insulator layer.

22. The vertical thin film transistor of claim 21 wherein said active semiconductor layer has an electrical conductivity controlled by a voltage on said gate electrode layer.

23. The vertical thin transistor of claim 21 wherein said substrate is formed of a material selected from the group consisting of glass, plastic, ceramic, insulating-film-coated steel and insulating-film-coated semiconductor.

* * * * *

UNITED STATES PATENT AND TRADEMARK OFFICE
CERTIFICATE OF CORRECTION

PATENT NO. : 7,629,633 B2  Page 1 of 1
APPLICATION NO. : 11/332483
DATED : December 8, 2009
INVENTOR(S) : Chan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 779 days.

Signed and Sealed this

Twenty-first Day of December, 2010

David J. Kappos
*Director of the United States Patent and Trademark Office*